United States Patent
Laine et al.

(10) Patent No.: US 9,653,003 B2
(45) Date of Patent: May 16, 2017

(54) NAVIGATION BY OCEAN SURFACE TOPOGRAPHY

(71) Applicant: The Charles Stark Draper Laboratory, Inc., Cambridge, MA (US)

(72) Inventors: Juha-Pekka J. Laine, Boston, MA (US); Gregory P. Blasche, Burlington, MA (US); Paul Bohn, Brighton, MA (US); Robin Mark Adrian Dawson, Waltham, MA (US); Walter Foley, Colton, NY (US); Benjamin F. Lane, Grafton, MA (US); Sean McClain, Somerville, MA (US); Erik L. Waldron, Concord, MA (US); Stephen P. Smith, Acton, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 14/636,419

(22) Filed: Mar. 3, 2015

(65) Prior Publication Data
US 2015/0268050 A1    Sep. 24, 2015

Related U.S. Application Data

(60) Provisional application No. 61/968,738, filed on Mar. 21, 2014.

(51) Int. Cl.
*G01C 21/20* (2006.01)
*G06F 17/10* (2006.01)
(Continued)

(52) U.S. Cl.
CPC .......... *G09B 29/10* (2013.01); *G01C 21/005* (2013.01); *G01C 21/20* (2013.01); *G06F 17/10* (2013.01); *G06F 17/5009* (2013.01)

(58) Field of Classification Search
CPC ...... G06F 17/5009; G06F 17/10; G01C 21/20
(Continued)

(56) References Cited

U.S. PATENT DOCUMENTS

| | | | | |
|---|---|---|---|---|
| 5,053,778 A | * | 10/1991 | Imhoff | G01S 13/90 342/191 |
| 8,380,427 B2 | * | 2/2013 | Taylor | G09B 27/04 701/400 |

(Continued)

OTHER PUBLICATIONS

Bristeau, et al., *Design of a navigation filter by analysis of local observability*, 49th IEEE Conference on Decision and Control, pp. 1298-1305, Dec. 15-17, 2010.
(Continued)

*Primary Examiner* — Nga X Nguyen
(74) *Attorney, Agent, or Firm* — Sunstein Kann Murphy & Timbers LLP

(57) ABSTRACT

Methods and apparatus ascertain a geographic position based on topographic contours of ocean surfaces. Observed ocean topographic contours are matched to predicted ocean topography and/or ocean topographic information stored in a database. Such systems and methods do not necessarily require INS, GPS, RF beacons, optical beacons or celestial sightings. These systems and methods may be used as references to correct INS. These systems and methods may be used to ascertain a geographic location of an aircraft, spacecraft, watercraft, landcraft (vehicle), person or the like. Similarly, these systems and methods may be used as part of a guidance system for guiding a craft to a destination. These systems and methods may be used in tandem with, or as backups for, other types of navigation or guidance systems or as one input to a navigation filter.

24 Claims, 25 Drawing Sheets

(51) Int. Cl.
G06F 17/50 (2006.01)
G09B 29/10 (2006.01)
G01C 21/00 (2006.01)

(58) Field of Classification Search
USPC .................. 701/21; 703/2; 342/26 A–26 B
See application file for complete search history.

(56) References Cited

U.S. PATENT DOCUMENTS

| | | | |
|---|---|---|---|
| 2006/0142943 A1* | 6/2006 | Park ................. | G01C 11/02 701/469 |
| 2008/0262988 A1* | 10/2008 | Williams ........... | G06N 3/12 706/13 |
| 2010/0052978 A1* | 3/2010 | Tillotson ........... | G01S 13/953 342/26 B |
| 2012/0192622 A1* | 8/2012 | Lane ................. | G01C 21/005 73/29.02 |
| 2016/0047657 A1* | 2/2016 | Caylor .............. | G01C 21/005 701/521 |

OTHER PUBLICATIONS

Eumetsat, *Jason-2 reliably delivers detailed oceanographic data vital to our understanding of weather forecasting and climate change monitoring,* Eumetsat, http://www.eumetsat.int/website/home/Satellites/CurrentSatellites/Jason2/index.html, 2 pages, Oct. 22, 2013.
InnoCentive, *Zero-GPS Precision Navigation,* InnoCentive Challenge, 1 page, Feb. 28, 2014.
Jet Propulsion Laboratory: California Institute of Technology, *Ocean Surface Topography,* http://podaac.jpl.nasa.gov/OceanSurfaceTopography, 2 pages, Aug. 1, 2013.
Jet Propulsion Laboratory: California Institute of Technology, *Ocean Surface Topography,* https://sealevel.jpl.nasa.gov/, 1 page, Jan. 5, 2014.
MarineBio, *Currents and Tides,* MarineBio.org, http://marinebio.org/oceans/currents-tides.asp, 14 pages, Mar. 17, 2014.
Military Analysis Network, *BGM-109 Tomahawk,* Smart Weapons, http://www.fas.org/man//dod-101/sys/smart/bgm-109.htm, 8 pages, Dec. 3, 2013.
Office of Satellite and Product Operations, *Sea Surface Height,* Office of Satellite and Product Operations, http://www.ospo.noaa.gov/Products/ocean/ssheight.html, 2 pages, Oct. 16, 2013.
Orange County Marine Institute / San Juan Institute Activity Series, *Visit to an Ocean Planet—Sea Surface Topography,* https://sealevel.jpl.nasa.gov/files/archive/activities/ts2meac2.pdf, 4 pages, 1998.
Ove Kent Hagen, *Terrain Navigation Principles and Application,* Forsvarets Forskningsinstitutt, 20 pages, Sep. 19, 2005.
Symbios, *Ocean Surface Topography Mission (Jason-2),* CEOS EO Handbook—Mission Summary, http://www.database.eohandbook.com/database/missionsummary.aspx?missionID=419, 1 page, Dec. 7, 2010.
Wikipedia, *Bathymetry,* Wikipedia, http://en.wikipedia.org/w/index.php?title=Bathymetryoldid=581173172, 4 pages, Nov. 11, 2013.
Wikipedia, *Ocean gyre,* Wikipedia, http://en.wikipedia.org/w/index.php?title=Ocean_gyre&oldid=591252718, 4 pages, Jan. 18, 2014.
Wikipedia, *Ocean Surface Topography Mission,* Wikipedia, http://en.wikipedia.org/w/index.php?title=Ocean_Surface_Topography_Mission&oldi, 6 pages, Dec. 16, 2013.
Wikipedia, *TERCOM,* Wikipedia, http://en.wikipedia.org/w/index.php?title=TERCOM&oldid=540955551, 4 pages, Feb. 27, 2013.
Wikipedia, *Topography,* Wikipedia, http://en.wikipedia.org/w/index.php?title=Topography&oldid=591134480, 7 Pages, Jan. 17, 2014.
Zhang, et al., *Seabed Topographic Contour Match Based on Angle Code Technique,* OCEANS 2010 IEEE, 4 pages, May 2010.
Zhang, et al., *Underwater Navigation Based on Topographic Contour Image Matching,* 2010 International Conference on Electrical and Control Engineering, IEEE Computer Society, 4 pages, Mar. 2010.

* cited by examiner

NAVIGATION BY OCEAN SURFACE TOPOGRAPHY

CROSS REFERENCE TO RELATED APPLICATIONS

This application claims the benefit of U.S. Provisional Patent Application No. 61/968,738, filed Mar. 21, 2014, titled "Navigation by Ocean Surface Topography," the entire contents of which are hereby incorporated by reference herein, for all purposes.

TECHNICAL FIELD

The present invention relates to geographic positioning and, more particularly, to determining a geographic position by matching observed ocean topography to known or predicted ocean topography.

BACKGROUND ART

Most known position determining or navigation systems and methods used above the surface of the earth depend on inertial navigation systems (INS), global positioning systems (GPS), radio-frequency (RF) location beacons, optical location beacons and/or celestial sightings. However, each of these has disadvantages. For example, INS systems drift over time and need to be periodically or occasionally corrected with aiding references, such as from a GPS. GPS signals and RF beacons are subject to disruption, such as by destruction or jamming by an enemy. Celestial sightings may not be available due to cloud cover or at a given time of day, such as during daylight hours.

SUMMARY OF EMBODIMENTS

Embodiments of the present invention provide systems and methods for using ocean surface gradients, primarily surface height gradients, for navigation. A system or method compares observed (measured) surface gradients to a catalog of known gradients and/or to gradients predicted by a model to ascertain its location. Although surface height gradients are the primary features matched, other surface gradients, such as temperature, water current and color, may be used. Ocean topography (meaning mapped surface gradients) is dynamic. However, some ocean topographic features remain relatively stable for days or weeks. Furthermore, most ocean topographic features can be predicted, based on historical ocean topographic data, known viscosities of ocean water, ocean currents, prevailing winds and the like, in some cases augmented with weather predictions, known time of year (season), etc. Essentially, the system uses known and/or predicted ocean surface gradients as geographic landmarks.

An embodiment of the present invention provides a geographic positioning system. The system includes a data source that provides topographical information about at least a portion of a surface of earth. The topographical information includes topographical information about contours of a surface of at least a portion of a body of water on the earth. The topographical information correlates the contours with geographic locations of the contours on the earth.

The system also includes a sensor configured to detect a contour of a portion of the surface of the earth.

The system also includes a contour matching engine coupled to the data source and to the sensor. The contour matching engine is configured to automatically match the detected contour to a contour provided by the data source. The contour matching engine is also configured to automatically provide a geographic location of the detected contour.

Optionally, the geographic positioning system includes a navigation filter. The navigation filter may be coupled to receive the geographic location provided by the contour matching engine. The navigation filter may also be coupled to receive at least one other geographic location provided by a corresponding at least one other geographic positioning system.

The at least one other geographic positioning system may include an inertial navigation system, a global positioning system (GPS) and/or a celestial sighting positioning system.

The topographical information about contours may include surface height gradient information, surface temperature gradient information and/or surface color gradient information.

The data source may include a prediction model. The prediction model may be configured to predict the topographical information based at least in part on historical ocean topographical information. The prediction model may be configured to predict the topographical information based at least in part on a time at which the sensor detects the contour, at least in part on a weather prediction, at least in part on information about a prevailing wind and/or at least in part on information about a current in the body of water.

The topographical information about contours may include surface height gradient information, surface temperature gradient information and/or surface color gradient information.

The data source may include a database that stores the topographical information about the surface of the at least a portion of the body of water. The topographical information stored in the database may include topographical information about contours of a portion of the surface of the earth not covered by a body of water.

The topographical information provided by the data source may include topographical information about contours of a portion of the surface of the earth not covered by a body of water.

The sensor may include a radar, a radio altimeter, a 3-dimensional imaging camera (such as a stereo camera), a laser altimeter, a LIDAR, a surface temperature sensor and/or a surface color sensor.

The sensor may be mounted to an aircraft, a spacecraft, a lighter-than-air craft and/or a mast of a watercraft.

Another embodiment of the present invention provides a method for ascertaining a geographic position. The method includes receiving topographical information about at least a portion of a surface of earth. The topographical information includes topographical information about contours of a surface of at least a portion of a body of water on the earth. The topographical information correlates the contours with geographic locations on the earth. The method also includes detecting a contour of a portion of the surface of the earth. The detected contour is automatically matched to a contour in the received topographical information. As a result of the matching, a geographic location of the detected contour is automatically provided.

The method may include: (a) providing the geographic location to a navigation filter and (b) providing at least one other geographic location from a corresponding at least one other geographic positioning system to the navigation filter. The navigation filter automatically calculates a solution geographic location, based on the geographic location and the at least one other geographic location.

Receiving the topographical information may include predicting the topographical information based at least in part on historical ocean topographical information.

Receiving the topographical information may include predicting the topographical information based at least in part on a time at which the sensor detects the contour, a weather prediction, information about a prevailing wind and/or information about a water current in the body of water.

Receiving the topographical information may include retrieving, from a database, topographical information about contours of a portion of the surface of the earth not covered by a body of water.

Detecting the contour of the portion of the surface of the earth may include imaging the portion of the surface of the earth with a radar, a radio altimeter, a 3-dimensional imaging camera, a stereo camera, a laser altimeter and/or a LIDAR. Detecting the contour of the portion of the surface of the earth may include imaging the portion of the surface of the earth from an aircraft, a spacecraft, a lighter-than-air craft and/or a watercraft.

Yet another embodiment of the present invention provides a computer program product for ascertaining a geographic position. The computer program product includes a non-transitory computer-readable medium having computer readable program code stored thereon. The computer readable program code is configured to cause a processor executing the program code to provide topographical information about at least a portion of a surface of earth. The topographical information includes topographical information about contours of a surface of at least a portion of a body of water on a surface of the earth. The topographical information correlates the contours with geographic locations on the earth. A contour of a portion of the surface of the earth is automatically detected. The detected contour is automatically matched to a contour in the received topological information. A geographic location of the detected contour is automatically provided.

Another embodiment of the present invention provides a method for predicting surface contour information about at least a portion of a body of water on a surface of earth. The method includes receiving historical contour information about the body of water on the surface of the earth and mathematically modeling a state of the body of water corresponding to a start time, based at least in part on the historical surface contour information. An index time is set equal to the start time. The method includes estimating rates of change of respective portions of the modeled state of the body of water and incrementing the index time. A new state of the body of water corresponding to the index time is estimated, based on the estimated rates of change and a previous modeled state of the body of water. The previous modeled state of the body of water is replaced with the estimated new state of the body of water.

Estimating the new state of the body of water corresponding to the index time, based on the estimated rates of change and a previous modeled state of the body of water, is repeated until the index time reaches a predetermined value. Predicted surface contour information about the body of water, is outputted, based on the estimated new state of the body of water.

Outputting the predicted surface contour information about the body of water may include outputting predicted surface height contour information about the body of water, outputting predicted surface temperature contour information about the body of water and/or outputting predicted surface color contour information about the body of water.

Optionally, a weather forecast may be received, and mathematically modeling the state of the body of water may include mathematically modeling the state of the body of water based at least in part on the weather forecast.

BRIEF DESCRIPTION OF THE DRAWINGS

The invention will be more fully understood by referring to the following Detailed Description of Specific Embodiments in conjunction with the Drawings, of which.

DETAILED DESCRIPTION OF SPECIFIC EMBODIMENTS

Figure 1:
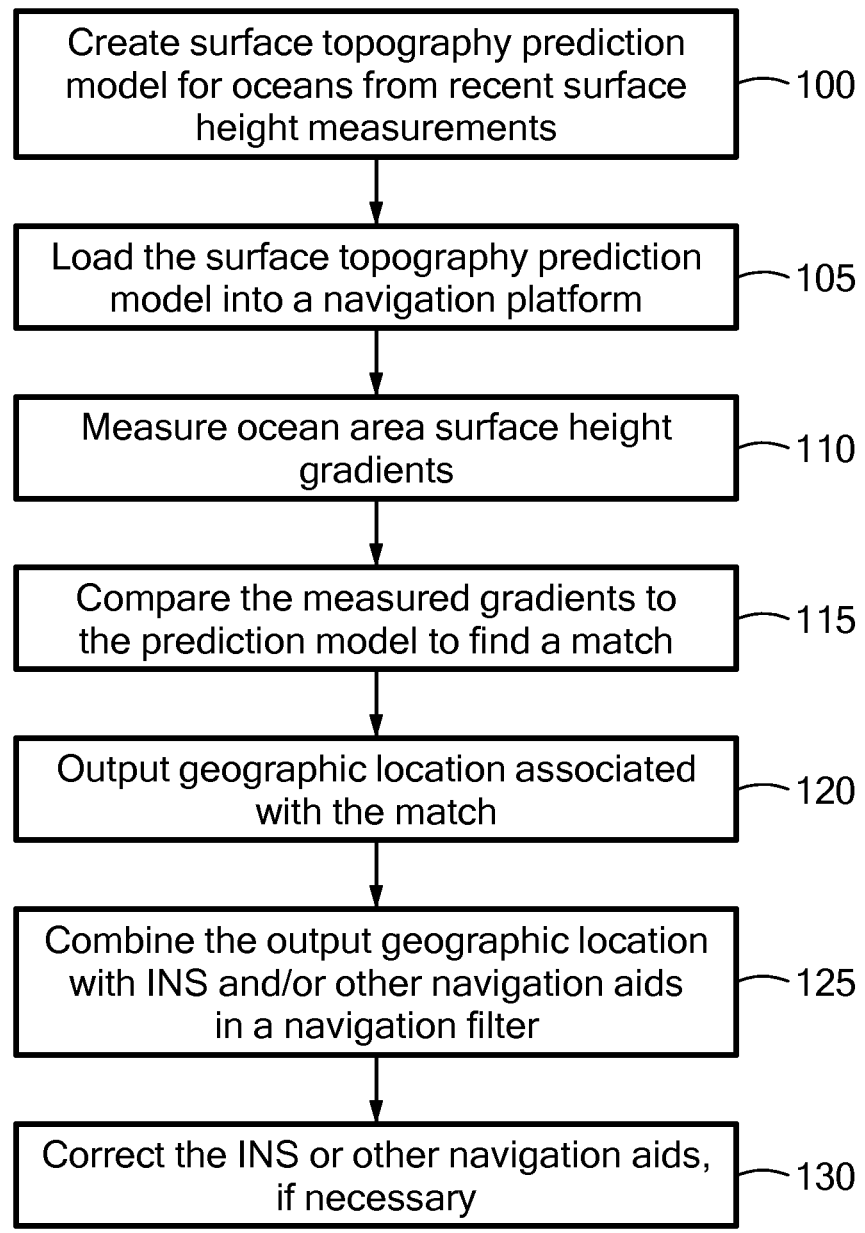
FIG. 1 is flowchart schematically illustrating operation of an embodiment of the present invention.

In accordance with embodiments of the present invention, methods and apparatus are disclosed for ascertaining a geographic position, based on known or predicted contours of ocean surfaces. Such systems and methods do not necessarily require INS, GPS, RF beacons, optical beacons or celestial sightings. The disclosed systems and methods may be used as references to correct INS and other navigation systems. The disclosed systems and methods may be used to ascertain a geographic location of an aircraft, spacecraft, watercraft, landcraft (vehicle), person or the like. Similarly, the disclosed systems and methods may be used as part of a guidance system for guiding a craft to a desired destination or along a desired path. The disclosed systems and methods may be used in tandem with, or as backups for, other types of navigation or guidance systems or as one input to a navigation filter.

Surface gradients and ocean topography primarily mean surface height gradients, and descriptions of embodiments presented herein are primarily given in relation to surface height gradients. However, other gradients, such as surface temperature gradients, water current gradients and surface color gradients, may be used.

As used herein, global positioning system (GPS) means a space-based satellite navigation system that provides location and time information where there is an unobstructed line of sight to four or more GPS satellites. GPS means the system deployed by the United States, as well as any other space-based satellite navigation system, such as the Russian Global Navigation Satellite System (GLONASS) and planned European Union Galileo positioning system, India's Indian Regional Navigational Satellite System and Chinese Compass navigation system.

Ocean Surface Topography

Oceans, seas, lakes, rivers and other bodies of water (collectively herein referred to as "oceans" or "bodies of water") cover approximately 71% of the earth's surface. (Unless context indicates otherwise, as used herein, "ocean" and "body of water" are synonymous.) Ocean surface topography primarily is the height of ocean level, relative to earth's geoid (equal-gravity surface), after variations due to tides have been subtracted. However, the ocean surface height is not uniform across the planet. Ocean currents, prevailing winds, storms, seafloor topography, the Coriolis force, etc. cause the ocean surface to be higher, relative to the center of the earth, average ocean surface level or other reference, in some places than in other places. Ocean and air currents carry heat from equatorial regions towards poles, thereby depressing or raising ocean surface levels, while winds depress or raise the ocean surface over large local regions. The ocean surface topography varies globally up to about two meters in height.

The world's ocean surface heights are mapped by satellite radar at least once every about ten days. For example, the Jason-1, Jason-2 and Jason-3 satellite missions map the world's ocean surface heights to within about 3 cm vertical accuracy. Jason-1's ground tracks fall midway between those of Jason-2's ground tracks, which are about 315 km (196 miles) apart at the equator. Jason-1's orbit causes the satellite to fly over the same region of the ocean as Jason-2 flew over five days earlier. This interleaving provides an accurate update of the topography of the ocean's surfaces.

The Ocean Surface Topography Mission (OSTM) on the Jason satellites uses precision ocean altimetry to measure distances between the satellite and the ocean surface. These very accurate observations of local variations in ocean surface height, known as ocean topography, provide information about global ocean level, speed and direction of ocean currents and heat stored in the ocean. Collected data has shown that change dynamics of large "gyres" are relatively slow, measured in weeks or months. We have discovered that surface height dynamics can be modeled and automatically predicted using techniques similar to automatic weather prediction. Thus, recent ocean topographic data may be used to generate a model that automatically predicts ocean topography over a subsequent time period, such as days, weeks or months.

Information about ocean topography is being gathered in support of research on global climate. However, we have discovered that ocean topography may be used for an entirely different purpose, i.e., ascertaining a geographic location or navigating a route over an ocean. Operation of systems and methods according to the present invention is summarized in a flowchart shown in FIG. 1. At 100, a surface topography prediction model for oceans is created from recent surface-height measurement data sets. At 105, the topography model is uploaded onto a navigating platform. The platform may be, for example, a high-altitude air or space vehicle or a high-speed vehicle. At 110, the navigation platform navigates by measuring ocean area surface height gradients, such as by radar or laser means, as a function of mission time. At 115, the navigation platform compares the measurements with the prediction model to find a match. At 120, the geographic location associated with the match is output. For example, at 125, the geographic location may be combined with a geographic location determined by an INS and/or other navigational aids in a navigation filter. The geographic location may be used to correct the INS at 130, if necessary.

A navigation filter combines inputs from several navigation systems, such as INS, GPS, celestial and ocean topography, and generates a geographic location. Embodiments of the present invention may use Kalman filters or other filters in their navigation filters. A Kalman filter, also known as linear quadratic estimation (LQE), is an algorithm that uses a series of measurements observed over time, containing noise (random variations) and other inaccuracies, and produces estimates of unknown variables that tend to be more precise than those based on a single measurement alone. More formally, the Kalman filter operates recursively on streams of noisy input data to produce a statistically optimal estimate of the underlying system state.

Figure 2:
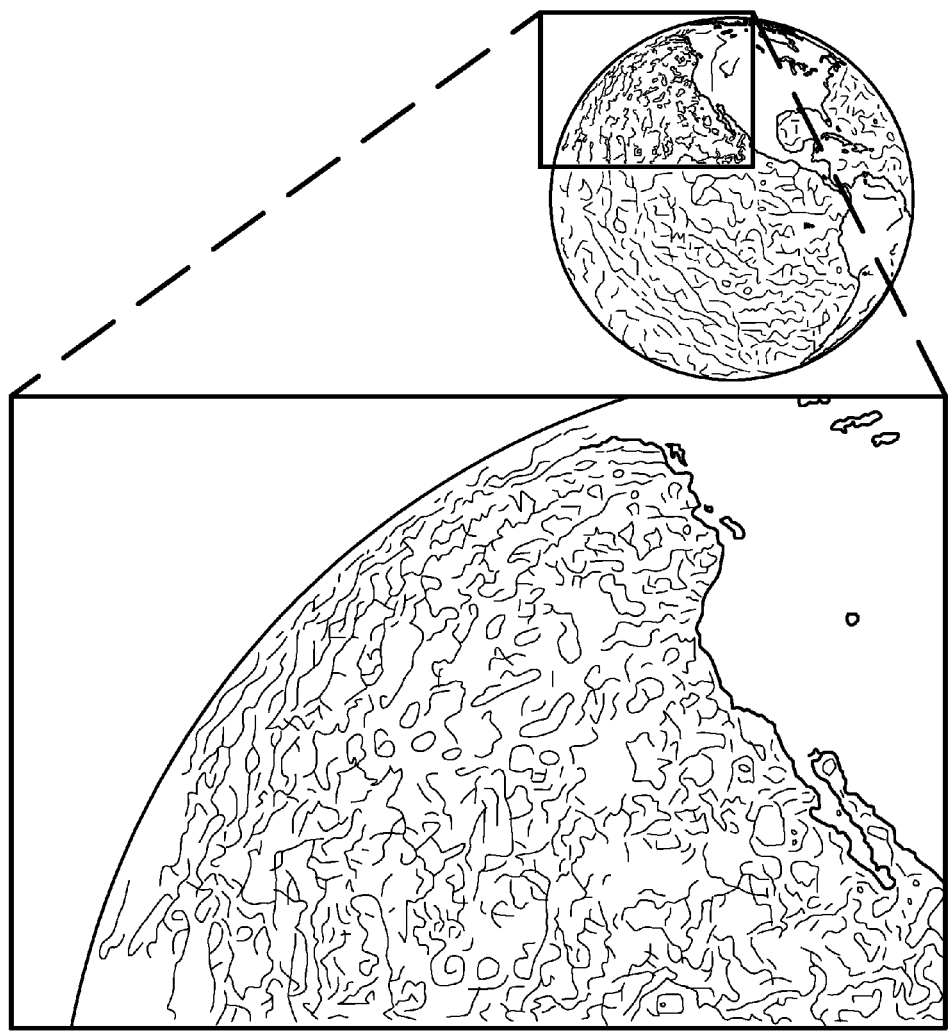
FIG. 2 is a color-coded image (here rendered in black and white) that maps ocean surface heights for a portion of the Pacific and Atlantic Oceans, according to the prior art.

FIG. 2 is a color-coded image (here rendered in black and white) that maps ocean surface heights for portions of the Pacific and Atlantic Oceans. Data for this map was collected by the OSTM/Jason-2 radar mapping mission. Colors in the original map indicate ocean surface height at a 3 cm resolution. Violet indicates heights below average sea level, red indicates heights above average ocean level and intermediate colors of the spectrum indicate respective intermediate heights. Some of the height detail is lost in FIG. 2, due to its having been converted to black and white. However, this detail is fully available, such as from the National Oceanographic Data Center (NODC), National Oceanic and Atmospheric Administration (NOAA), United States Department of Commerce, for example at www.nodc.noaa.gov/sog/. It is expected that future missions will measure ocean surface height at better vertical resolutions, as well as with better latitudinal and longitudinal resolution.

Ocean Topography Prediction

Figure 3:
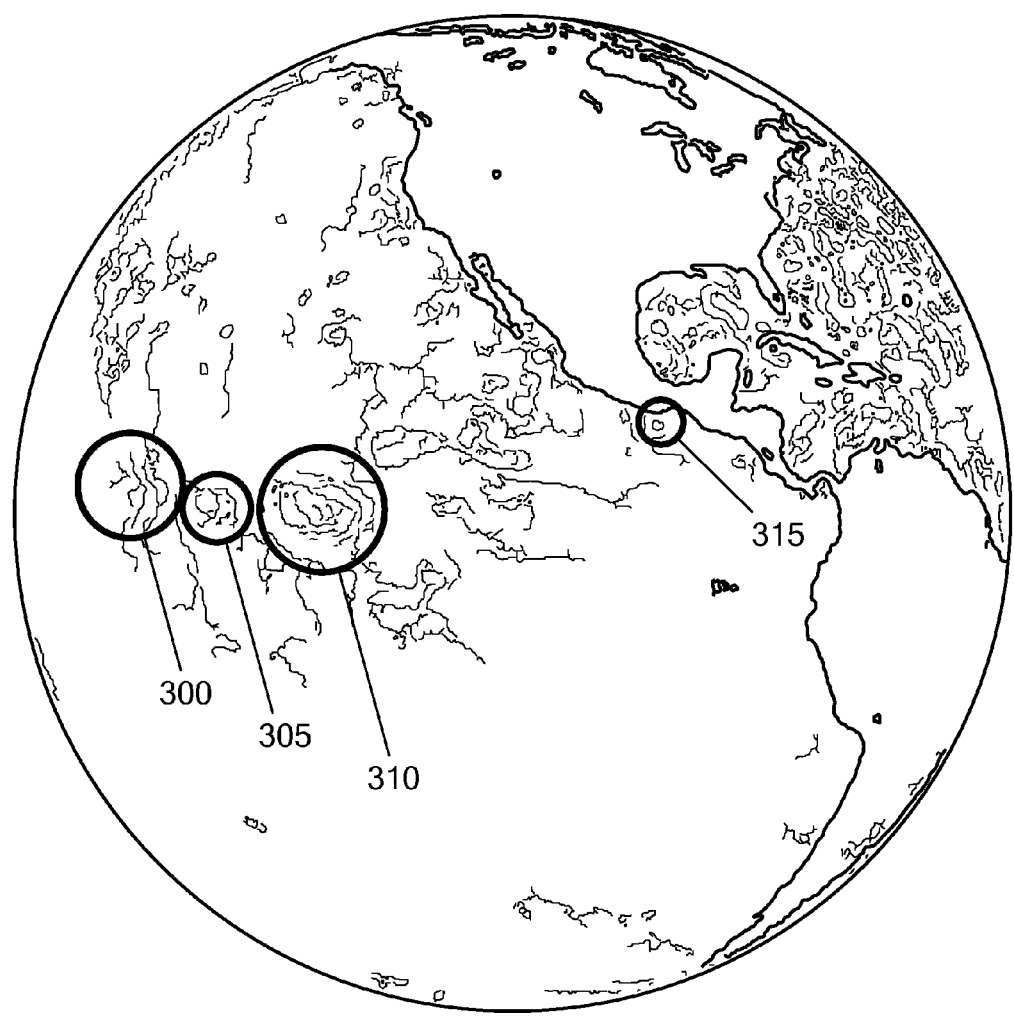
FIGS. 3-19 contain a set of sequential simplified ocean topographical maps illustrating how the ocean topography of portions of the Pacific and Atlantic Oceans has changed over a period of time.

Information gathered by OSTM or other systems about contours of all or a portion of the oceans of the earth may be stored in a database, along with information correlating the contours with geographic locations on the earth. However, ocean topography is dynamic, i.e., the topography of the ocean's surface changes over time. FIGS. 3-19 contain a set of sequential simplified ocean topographical maps illustrating how the ocean topography of portions of the Pacific and Atlantic Oceans has changed over a time period. These maps were generated from actual OSTM maps generated from Jason data captured at 10-day intervals. However, in the interest of clarity, the maps were simplified and converted to line drawings. Nevertheless, in FIG. 3, four regions of relatively high ocean surface levels can be seen at 300, 305, 310 and 315 (enclosed in heavy circles for clarity).

Figure 4:
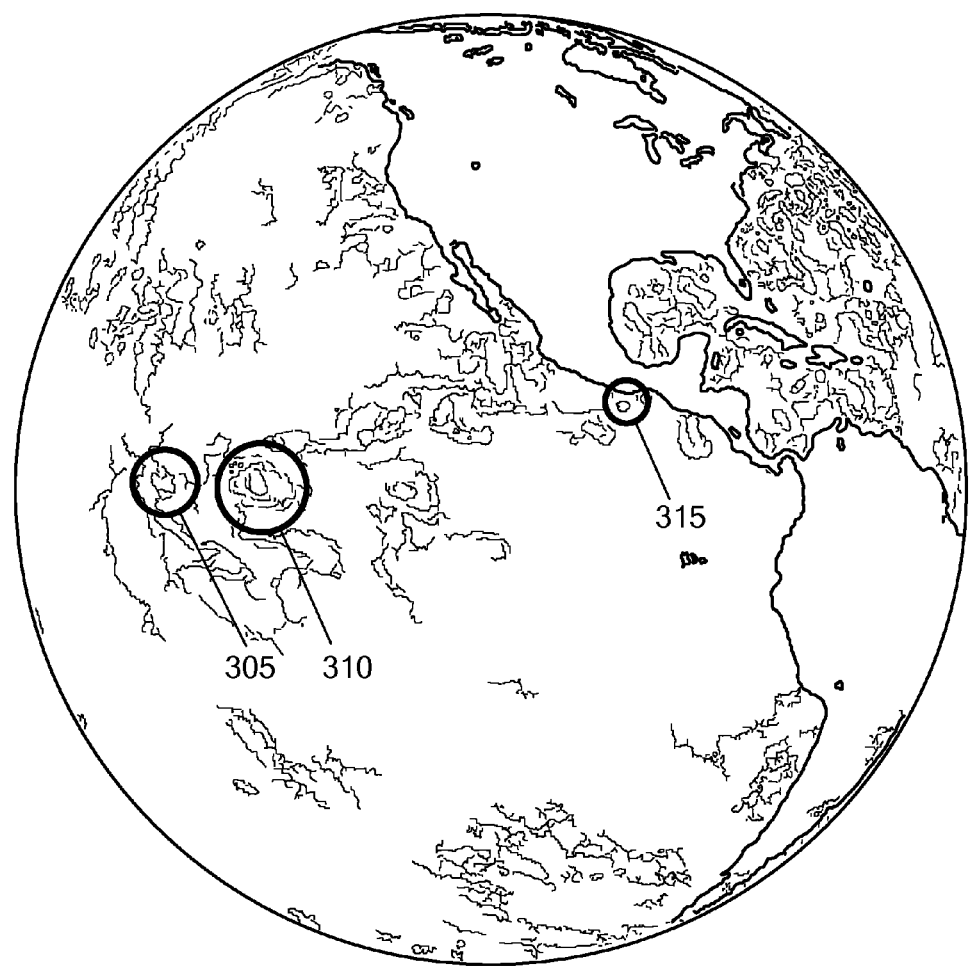
Figure 5:
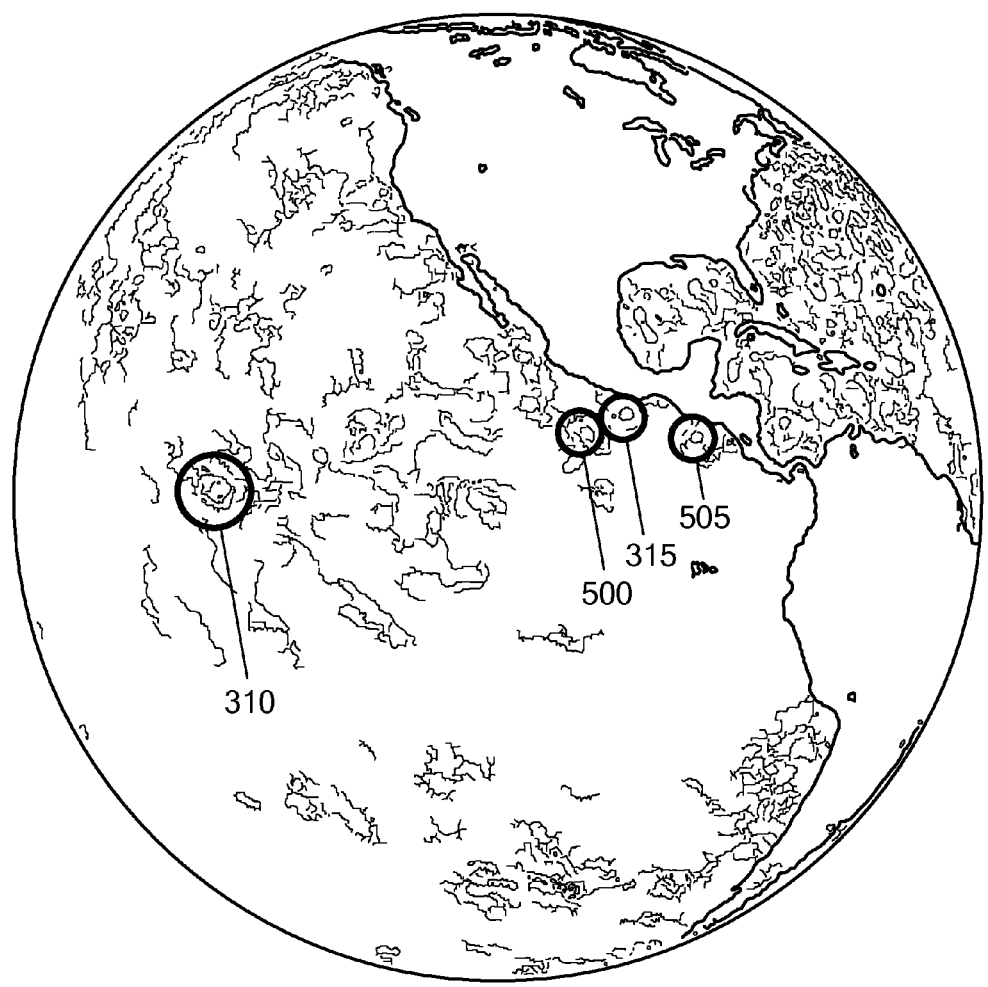
Figure 6:
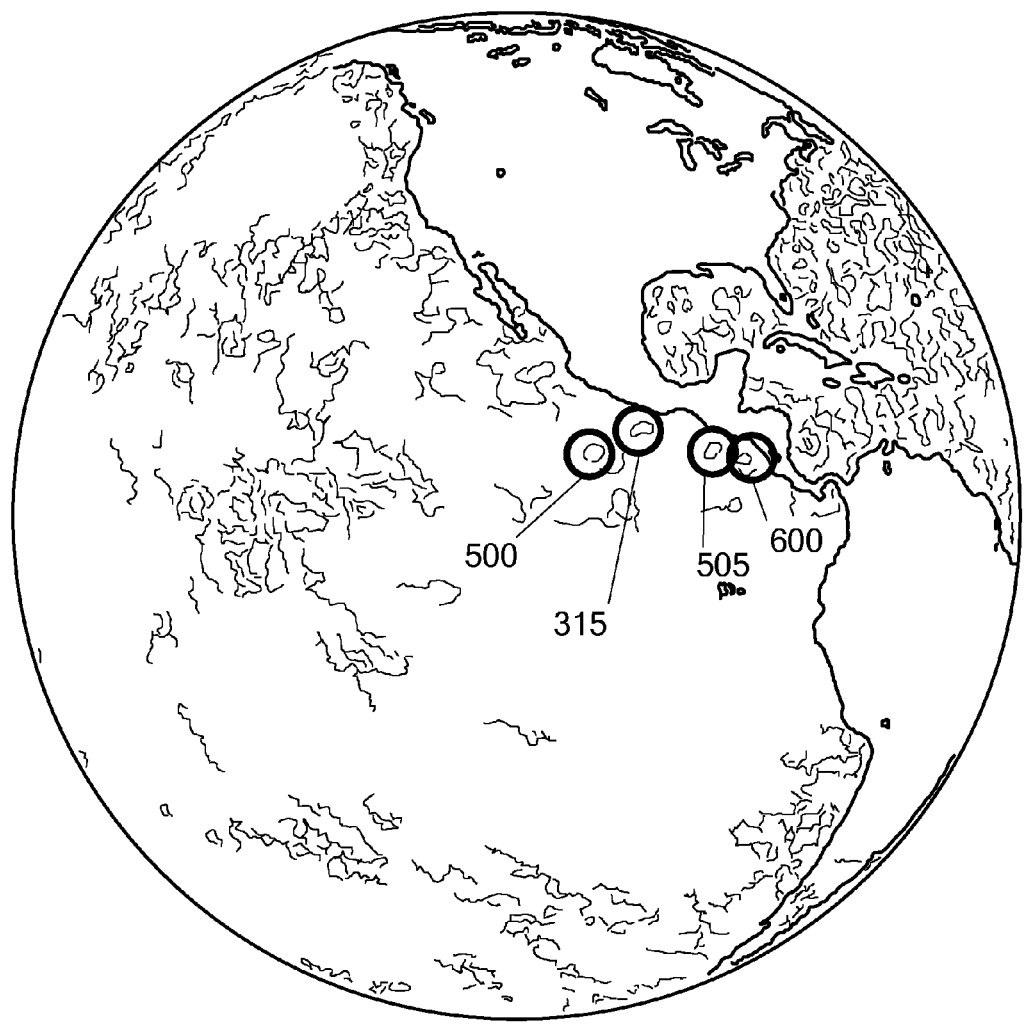
Figure 7:
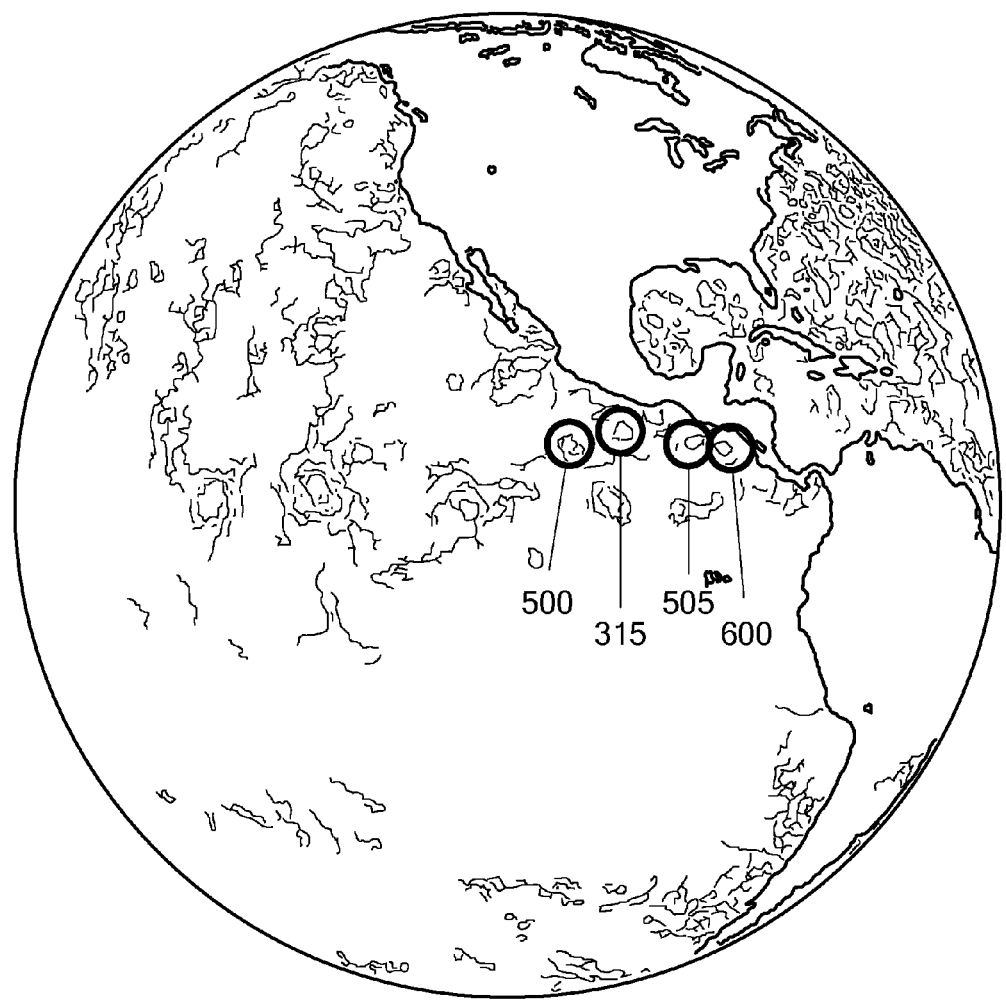
Figure 8:
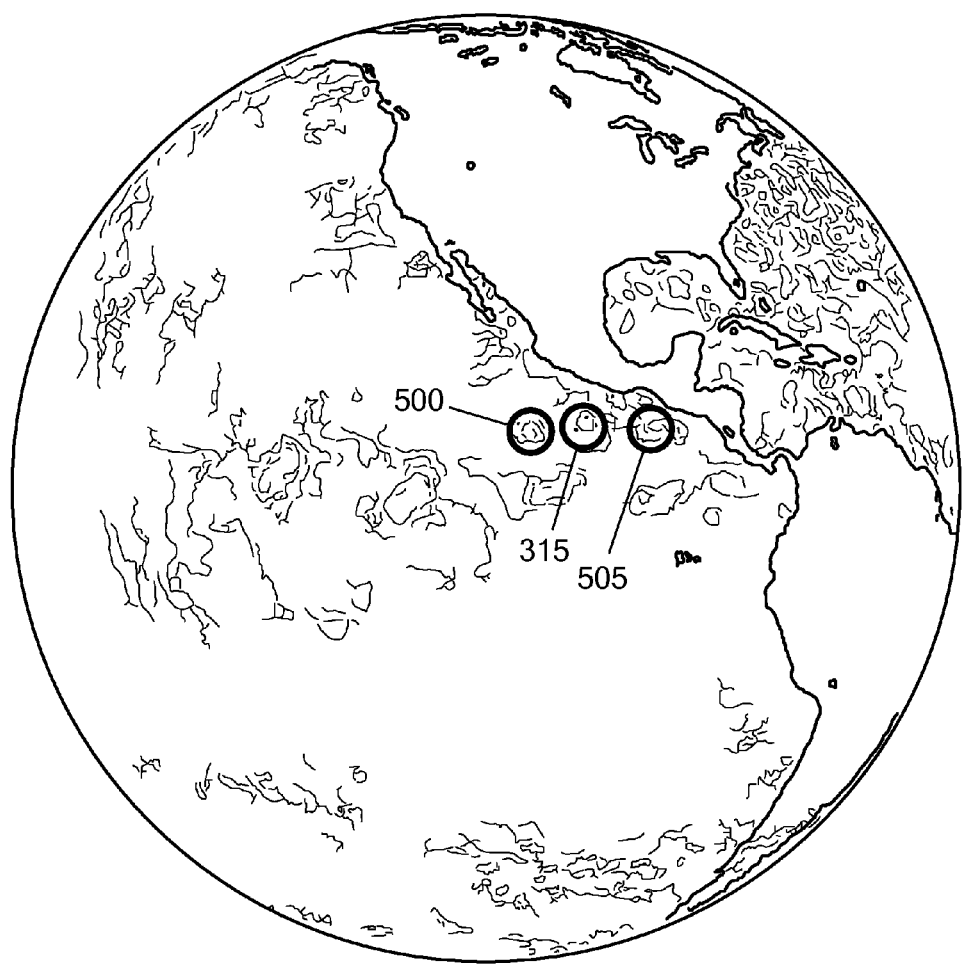
Figure 9:
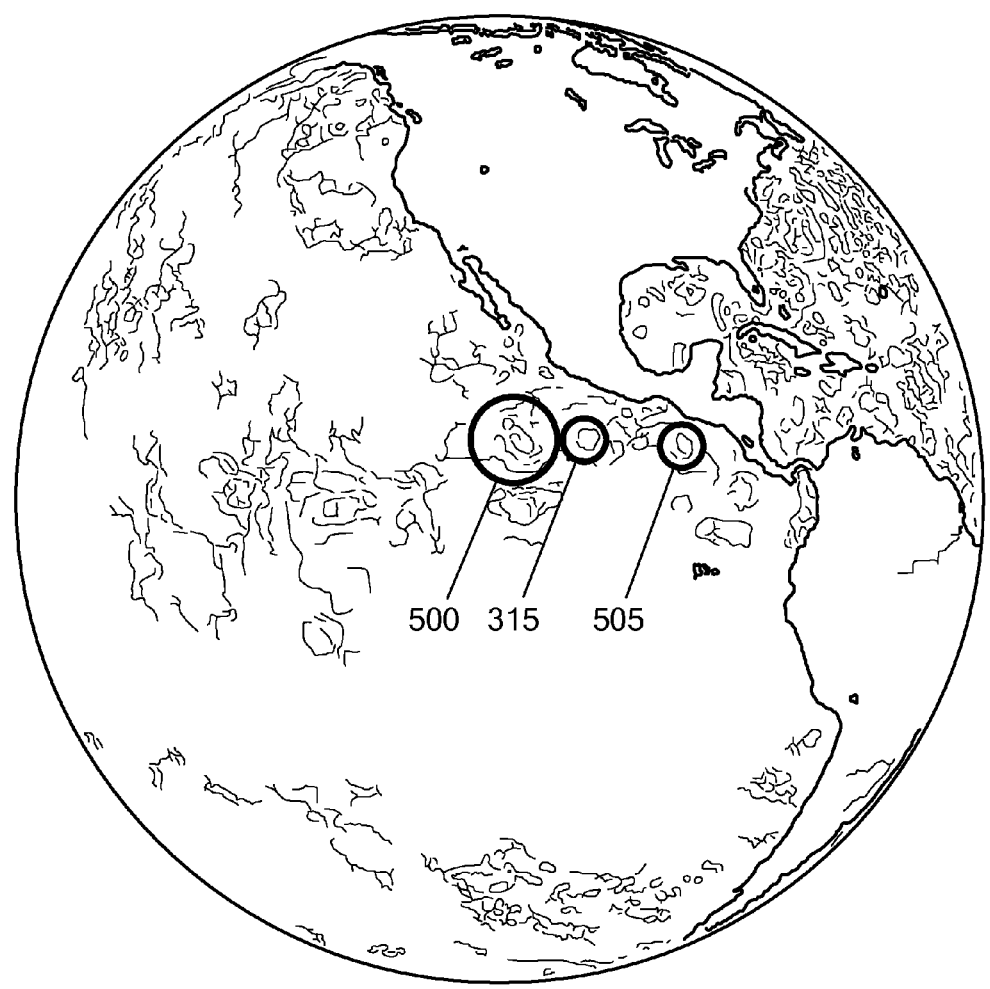
Figure 10:
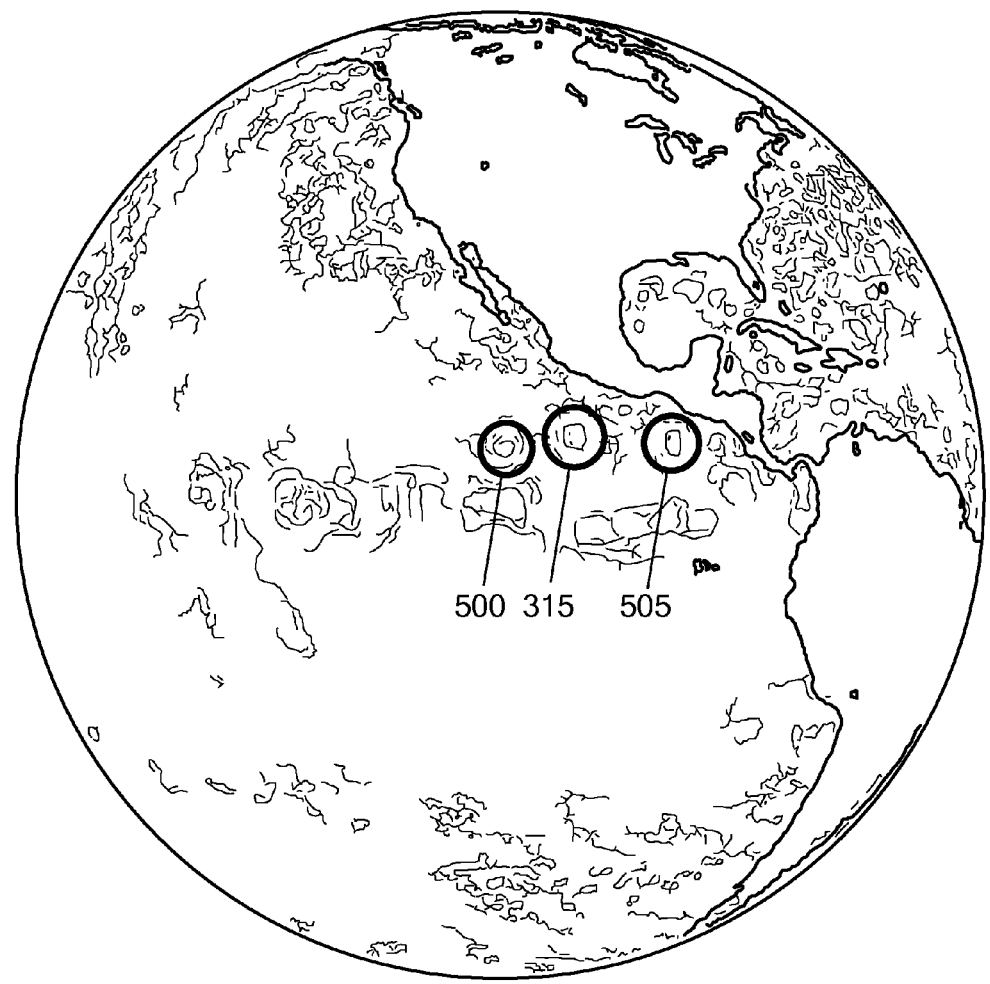
Figure 11:
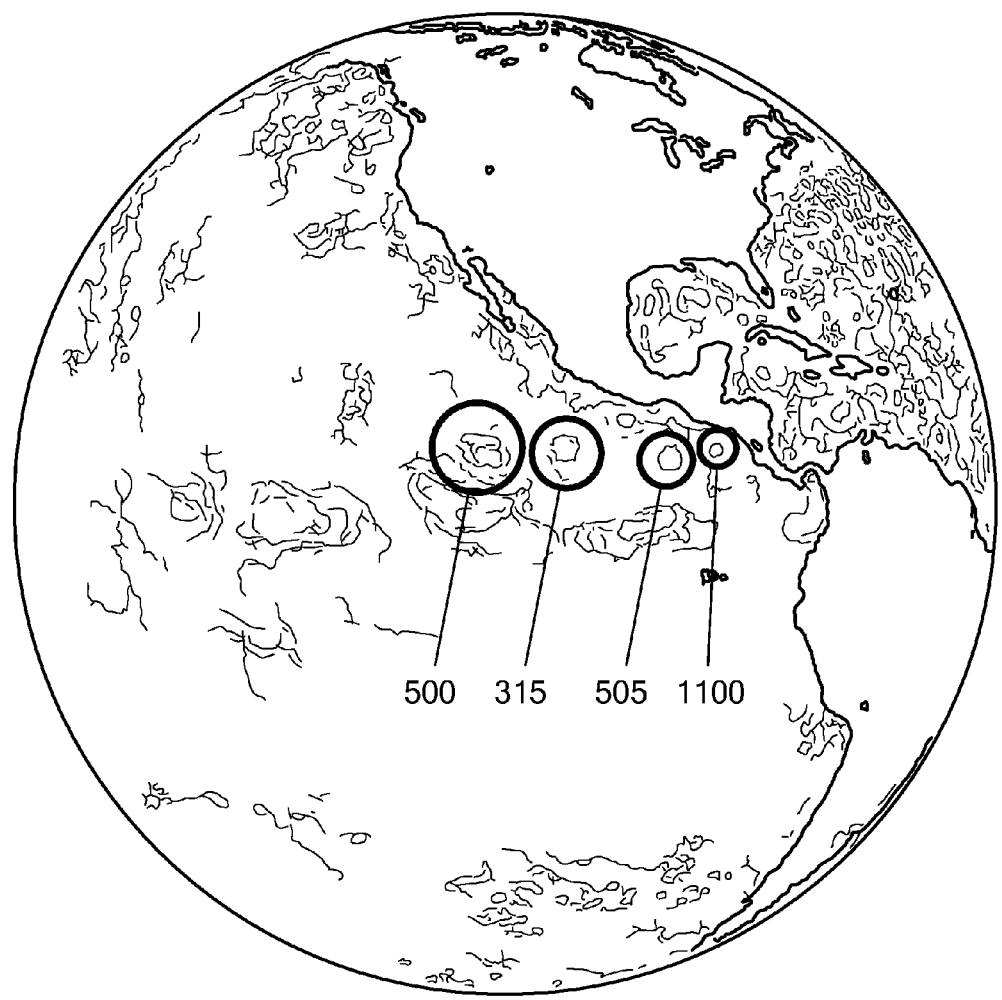
Figure 12:
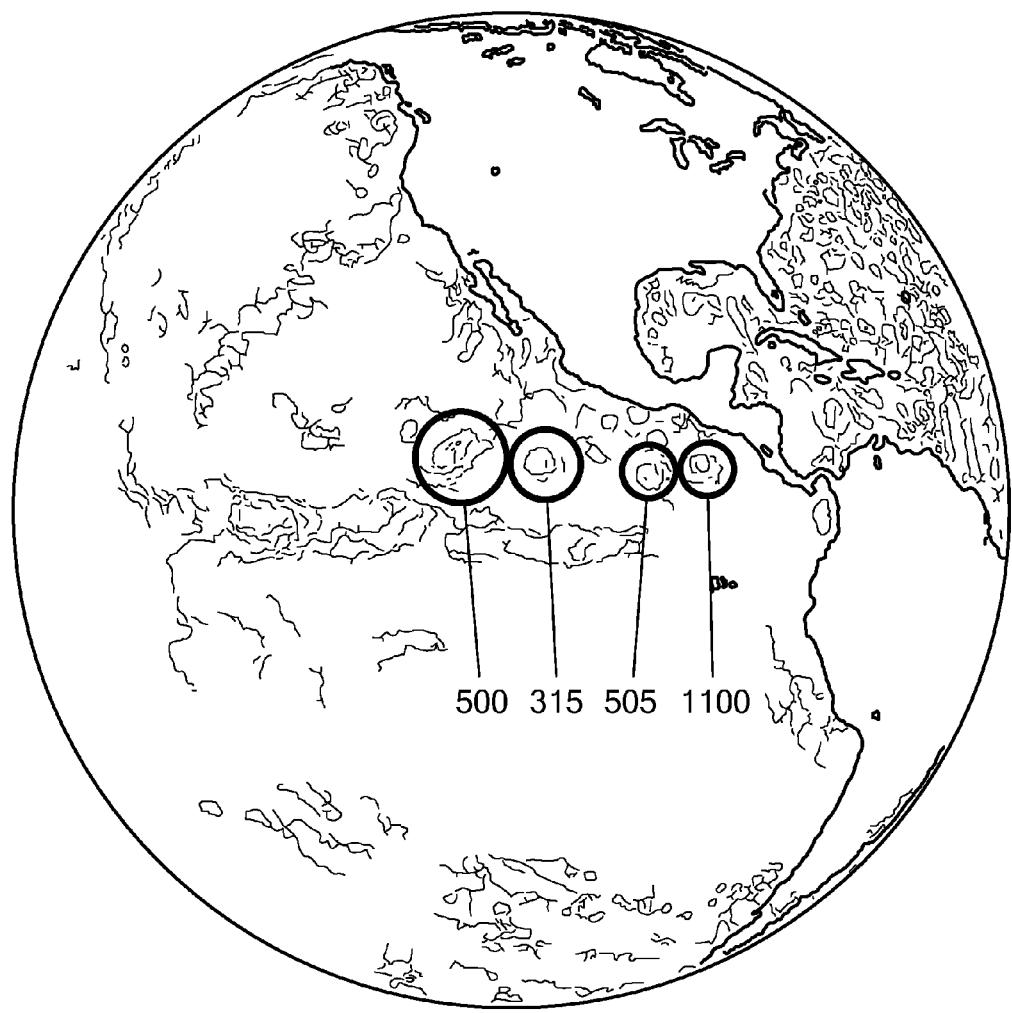
Figure 13:
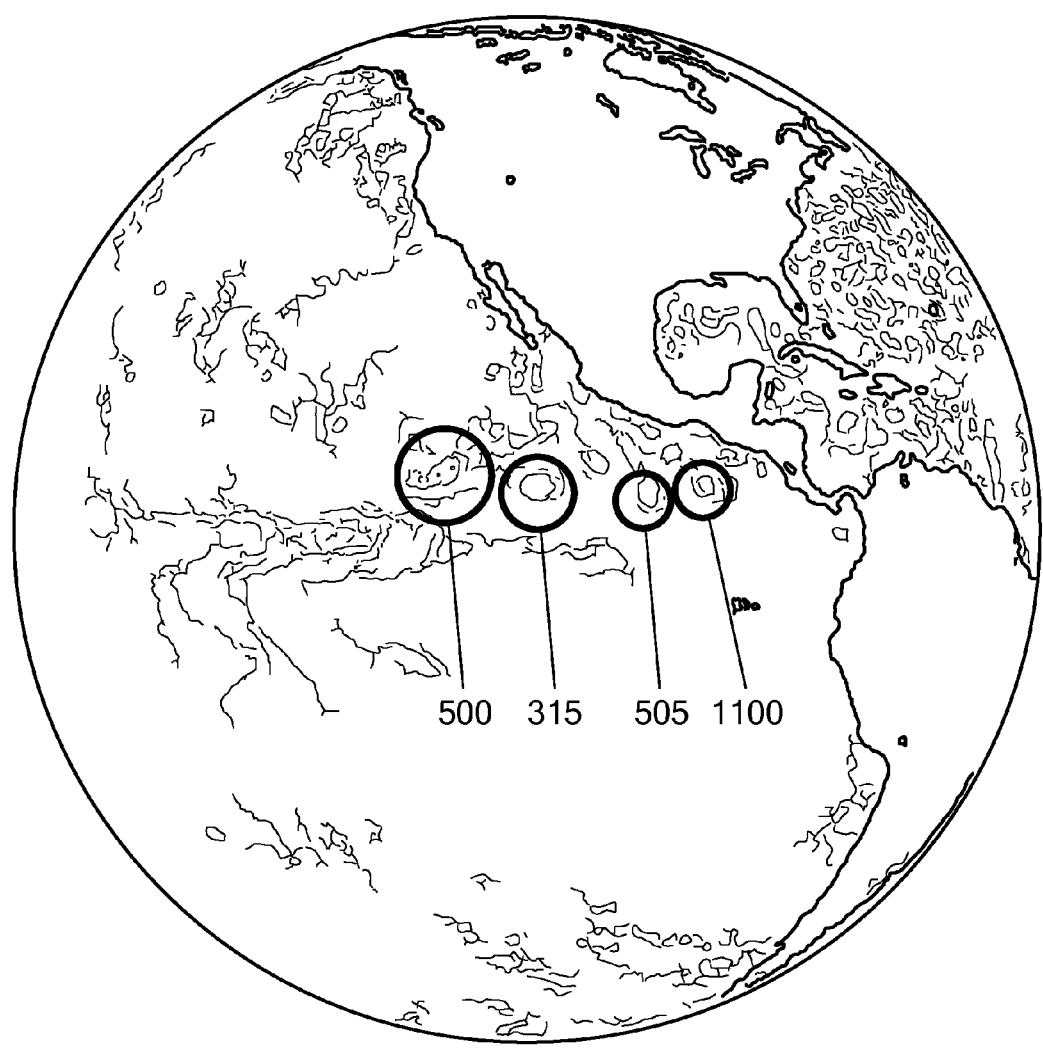
Figure 14:
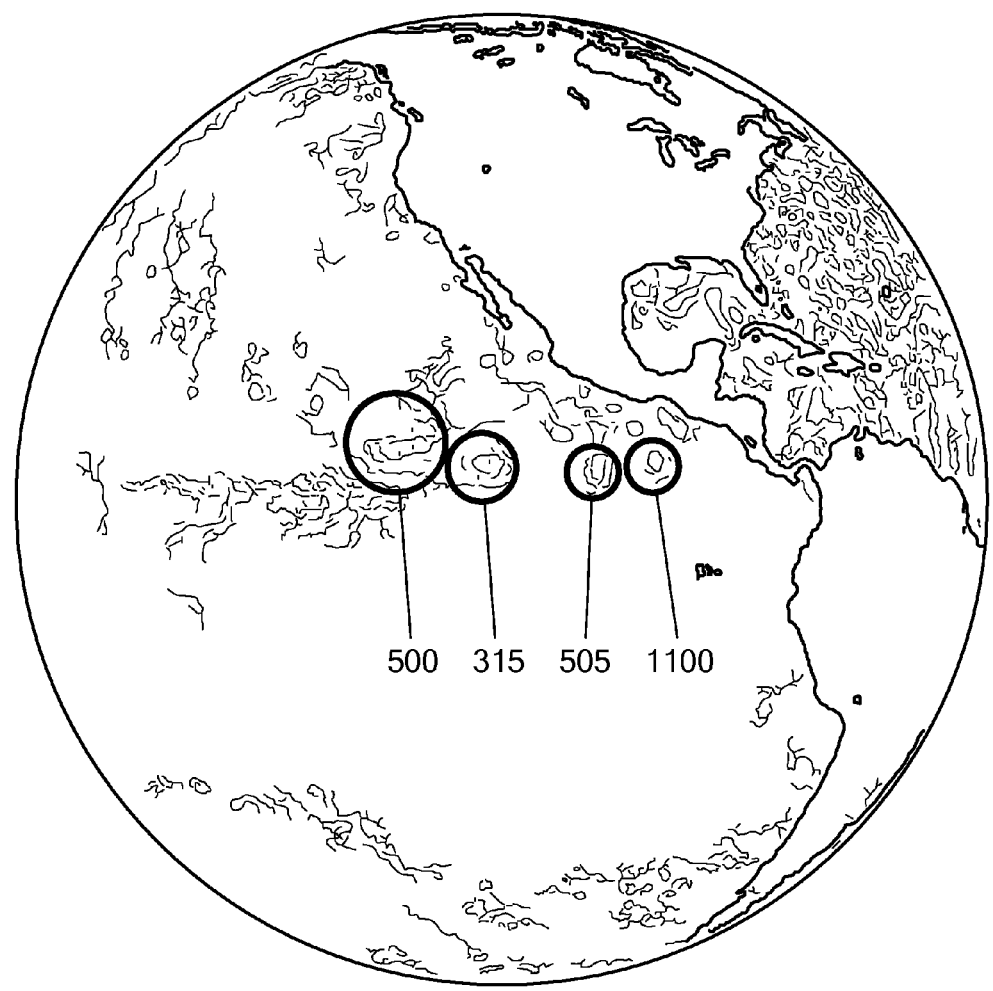
Figure 15:
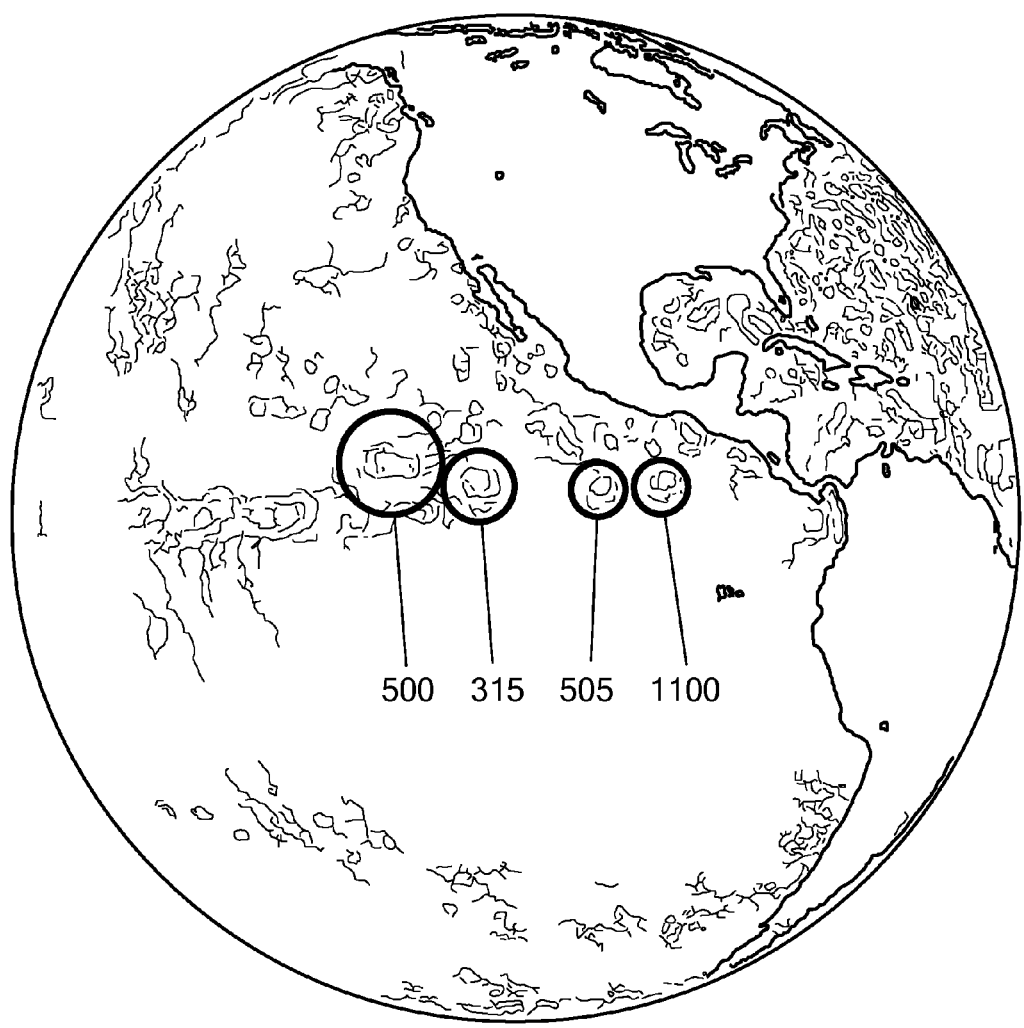
Figure 16:
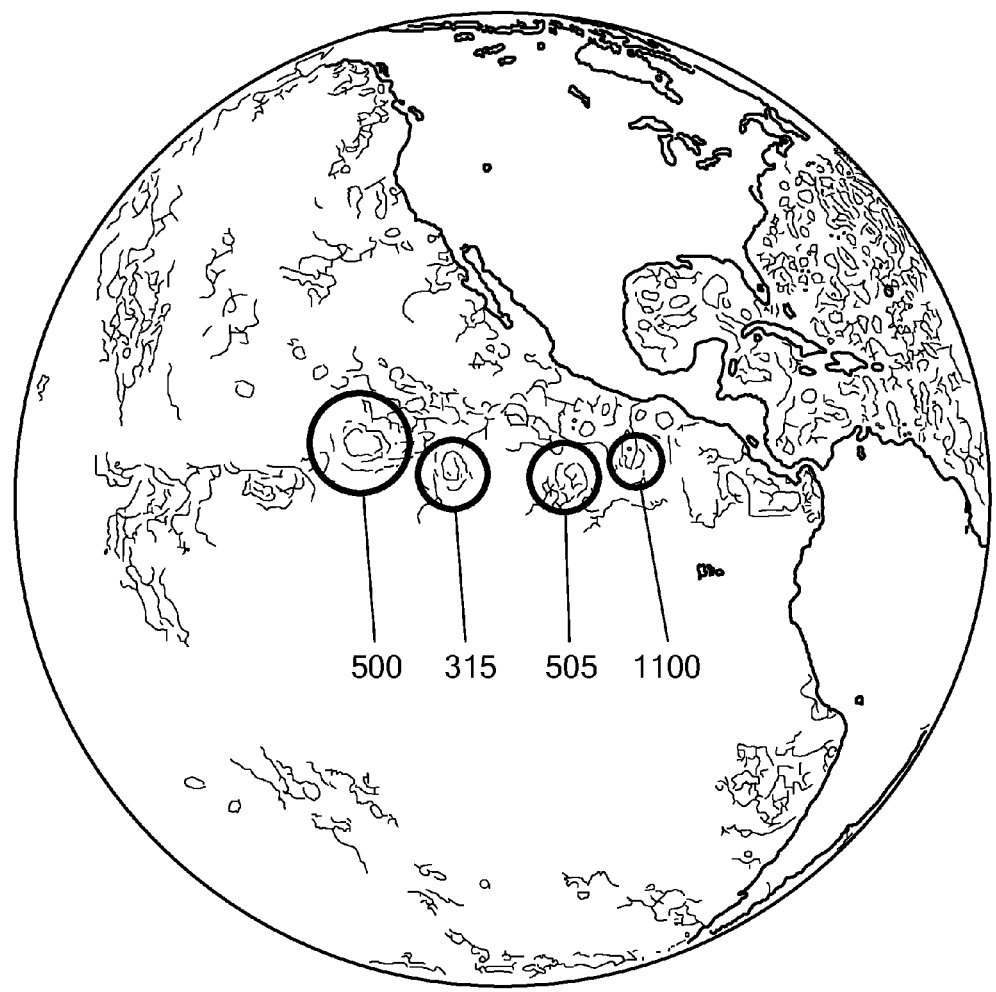
Figure 17:
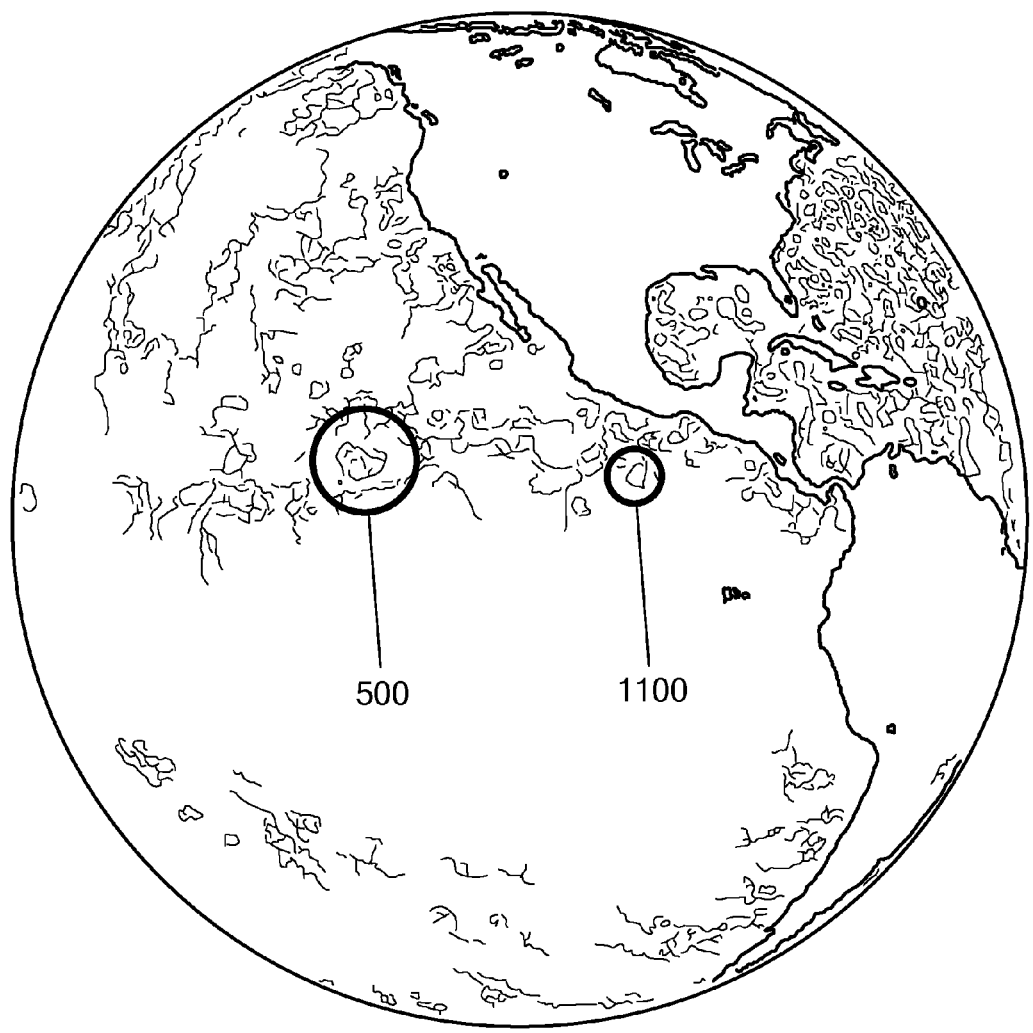
Figure 18:
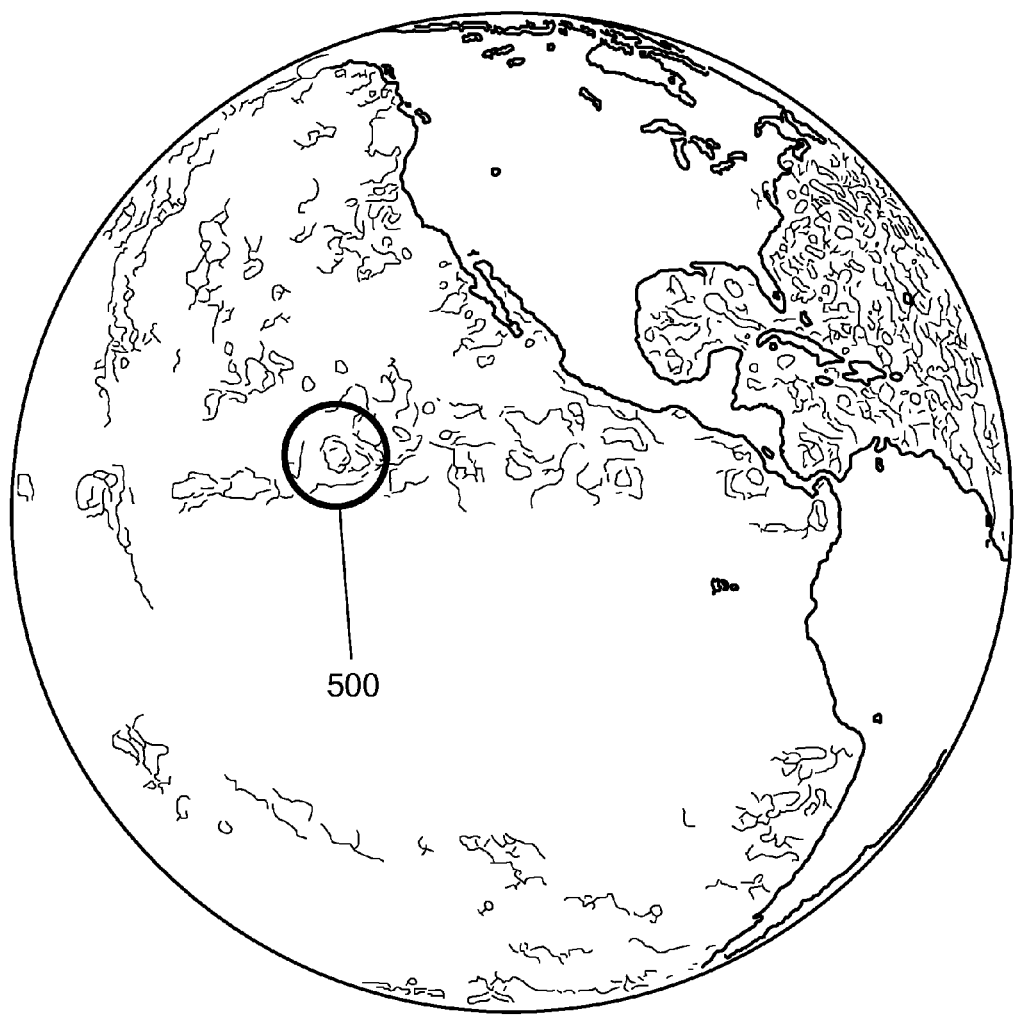
Figure 19:
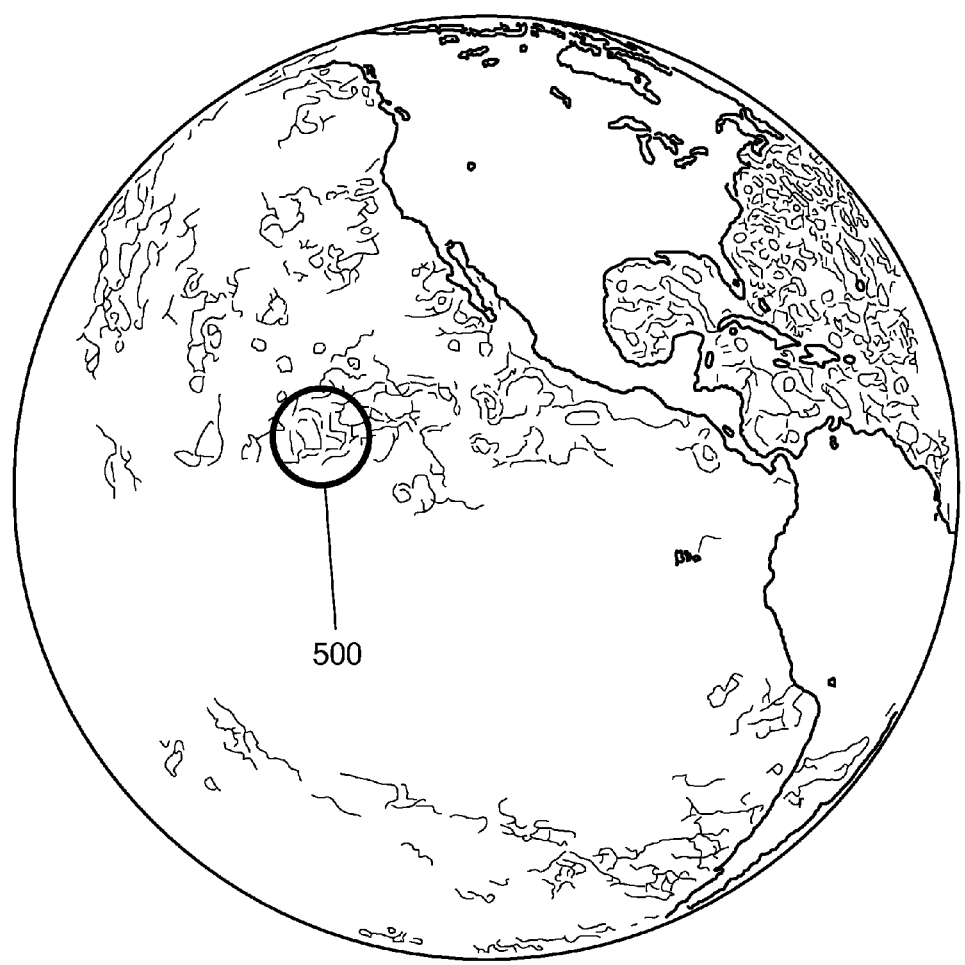

In FIG. 4, region 300 has dissipated or drifted out of sight, and regions 305-315 have drifted westward. In FIG. 5, region 305 has dissipated, and regions 310 and 315 have drifted westward. In addition, two new regions of relatively high ocean surface levels 500 and 505 appeared. In FIG. 6, region 310 has dissipated, regions 315, 500 and 505 have drifted westward, and another region of relatively high ocean surface level 600 has formed. In FIGS. 7-10, regions 315, 500 and 515 have drifted progressively westward. In FIGS. 11, 315, 500 and 515 have drifted progressively westward, and a new region of relatively high ocean surface level 1100 has formed. In FIGS. 12-16, regions 315, 500, 505 and 1100 have drifted progressively westward. In FIG. 17, regions 315 and 505 have dissipated, and regions 500 and 1100 have drifted westward. In FIG. 18, region 1100 has dissipated, and region 500 has drifted westward. In FIG. 19, region 500 has drifted westward and has nearly dissipated.

As can be seen from the sequence of maps in FIGS. 3-19, regions of relatively high ocean surface level form and drift along relatively smooth tracks, such as a result of winds and/or ocean currents. Similarly, regions of respectively relatively low and intermediate ocean surface levels form and drift. These regions form, grow and dissipate relatively smoothly. That is, their areas increase and decrease relatively smoothly. Consequently, near-future ocean topography may be predicted, based on historical ocean topographical data, in some cases augmented by information about prevailing winds, known ocean currents, predicted weather, such as winds and storms, precipitation amounts, time of year (season) and the like.

Ocean topography can be predicted by a prediction model. The gathered information about contours, such as from OSTM, may be used to construct a mathematical prediction model of the surface of all or a portion of the oceans of the earth. Because ocean topography is dynamic, the term "dynamic map" is used to refer to predicted ocean topography. Ocean topographic features can be predicted, based on historical ocean topographic data, ocean currents, prevailing or predicted winds and the like, in some cases augmented with weather predictions.

An embodiment includes a predictive model that generates a volumetric forecast of water displacement over large distances. Height information is sampled across all or a portion of a body of water over a given time period, such as by satellites, as described above. This initial data is fed into a computer simulation that estimates future water height gradients by use of fluid-dynamic and thermo-dynamic principles. If the initial data is irregularly spaced, data assimilation and objective analysis methods perform quality controls and obtain values at locations usable by the model's mathematical algorithms, usually an evenly spaced grid. This provides the model with a starting point for a forecast (prediction). Because the starting point may include recent historical data, the model may initially analyze the data to ascertain recent rates of change at various points in the data and use these recent rates of change to predict future rates of change.

A set of equations, commonly referred to in the modeling art as primitive equations, use the starting point data to generate predicted rates of change at various points in the grid of a modeled body of water. The rates of change are used to predict a state of the body of water a short time ("time step") in the future. The predicted state of the body of water is then used as a starting point for a new prediction, and the primitive equations predict new rates of change, which are used to predict a new state of the body of water further in the future. This procedure is repeated (iterated) until a prediction for a desired time in the future is generated.

In addition to water height data and knowledge of the Coriolis effect, the simulation primitive equations may make use of wind and thermal data and models, known viscosities of ocean water, known ocean currents, such as the Gulf Stream, prevailing winds, ocean floor topography, land-water boundaries and the like, in some cases augmented with weather predictions, known time of year (season), etc. For example, some portions of the surface of the earth are known to have particular weather patterns at certain times of the year. Predicted hurricanes may, for example, be predicted to raise ocean levels ahead of them as storm winds drive ocean water ahead of the advancing storms.

As those of skill in the modeling art know, the time step between iterations may be based on various factors, such as distance between the points on the computational grid and the original data sampling rate. The prognostication range of the model may be on the order of tens of days or weeks.

Figure 25:
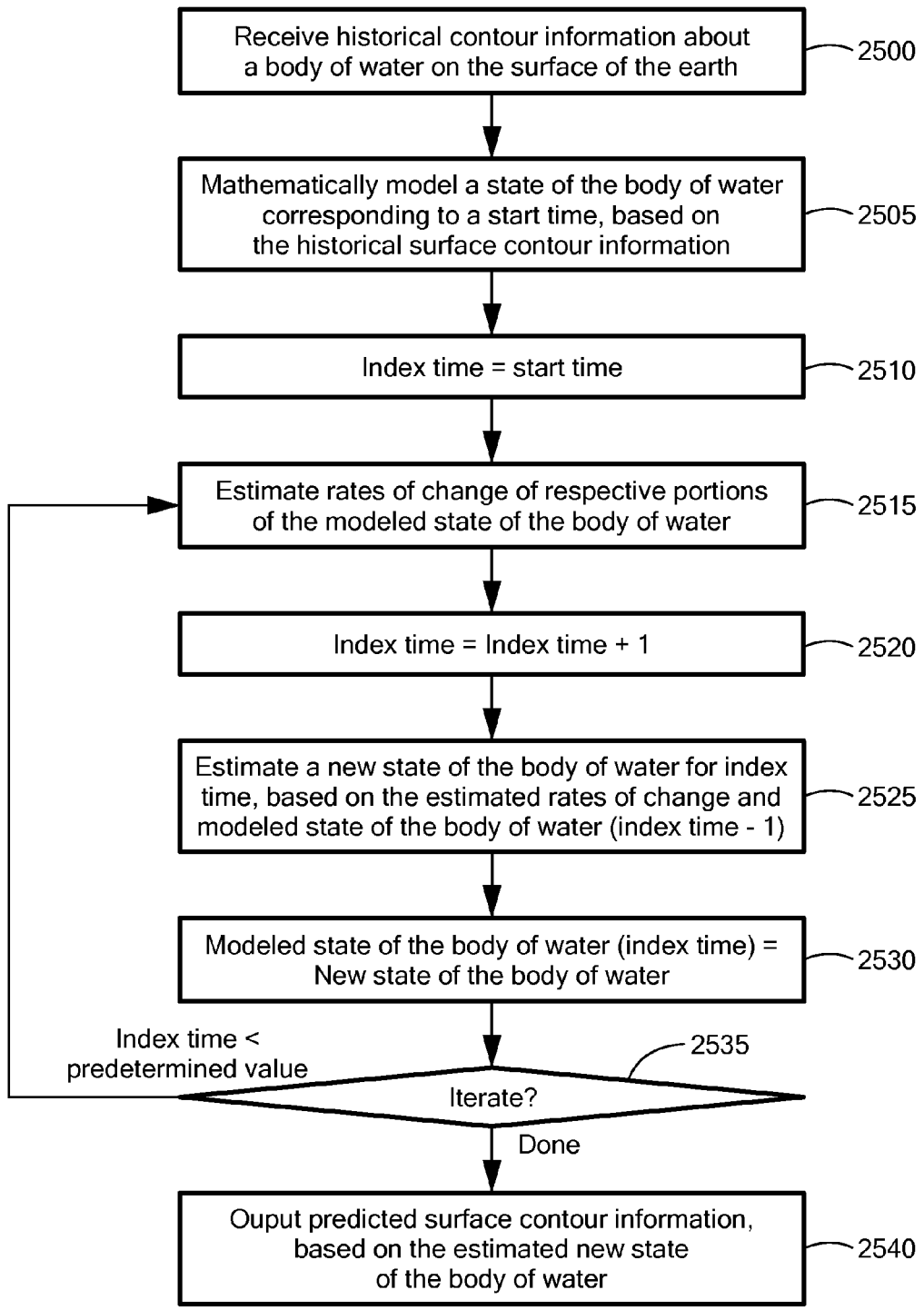
FIG. 25 contains a flowchart illustrating operation of a surface contour prediction model, according to an embodiment of the present invention.

FIG. 25 contains a flowchart illustrating operation of a surface contour prediction model, according to an embodiment of the present invention. At 2500, historical contour information about a body of water on the surface of the earth is received. At 2505, a state of the body of water corresponding to a start time is mathematically modeled, based on the historical surface contour information. At 2510, an index time is set equal to the start time. At 2515, rates of change of respective portions of the modeled state of the body of water are estimated. At 2520, the index time is incremented. At 2525, a new state of the body of water corresponding to the index time is estimated, based on the estimated rates of change and a previous modeled state of the body of water. At 2530 the previous modeled state of the body of water is replaced with the estimated new state of the body of water. At 2535, if the index time has not yet reached a predetermined value, control passes to 2515, otherwise control passes to 2540. At 2540, predicted surface contour information about the body of water is outputted, based on the estimated new state of the body of water.

Water flow rates and levels in rivers may vary seasonally, such as due to spring snowmelt, as well as a result of recent precipitation in their drainage basins (watersheds). Recent precipitation amounts, predicted precipitation, time of year, average temperature and other factors may be used to predict flow rates or water levels in rivers. River beds may include topographic features, such as boulders and curves, that influence river water flow and, therefore, topography of the river's surface. The surface topography may be predicted based on knowledge of the river bed topography and predicted water flow rates and/or levels.

Although surface height gradients are the primary features modeled and matched, other surface gradients, such as temperature, water current and color, may be used. Thus, in other embodiments, these and other surface gradient features may be modeled.

The prediction model may be implemented in whole or in part by a processor executing instructions stored in a memory. The instructions may cause the processor to perform an algorithm, somewhat similar to a weather prediction algorithm, although with different inputs, assumptions and outputs, as described above.

Altitude Above Ground Level and Altitude Measuring Devices

In aviation and atmospheric sciences, an altitude above ground level (AGL altitude) is an altitude measured with respect to an underlying ground surface, as opposed to altitude/elevation above mean sea level (AMSL) or, in broadcast engineering, height above average terrain (HAAT). In other words, these expressions (AGL, AMSL, or HAAT) indicate where a "zero level" or "reference altitude" is located.

As is well known in the art, a radar altimeter (RA), electronic altimeter, reflection altimeter, radio altimeter (RADALT), low range radio altimeter (LRRA), laser altimeter, sometimes referred to as a light radar (LIDAR or LiDAR, sometimes referred to as LADAR) or the like measures altitude above terrain (land or an ocean) presently beneath a sensor, typically in an aircraft or spacecraft. This type of altimeter provides distance between an antenna or other type of receiving device and land or ocean directly below it, in contrast to a barometric altimeter, which provides the distance above a defined datum, usually mean ocean level. Radar altimeters normally work in the E band, Ka band or, for more advanced ocean-level measurement, S band.

Radar altimeters provide a reliable and accurate method of measuring height above water. The radar altimeter measures return power of a radar pulse that is reflected off a land or ocean surface. Temporal evolution of the reflected radar pulse is interpreted in order to estimate the distance between the radar altimeter and the reflecting surface. The time evolution of the return power measured from the footprint of the radar signal reflecting off the ocean or land surface can be described in three parts: (1) the time before the pulse arrives; (2) the time after the beginning of the pulse has arrived but before of the tail of the pulse has arrived; and (3) after the tail of the pulse has arrived. Alternatively, frequency modulated continuous-wave radar can be used. The greater the frequency shift in the returning signal, the further the distance traveled by the outgoing and returning signals. This method can achieve much better accuracy than pulsed radar for the same outlay. The primary difference between delay-Doppler (or synthetic aperture radar) and pulse-limited altimetry is that delay-Doppler altimetry looks at a smaller section of the pulse-limited radar footprint, but emits far more pulse signals to give the effect of covering the same footprint as pulse-limited radar, but with better resolution.

Alternatively, topographical data may be generated by appropriate processing of images from 2-dimensional imaging cameras (photogrammetry, such as using stereo cameras), laser scanners (rangefinders), synthesis of 3-dimensional surfaces from 2-dimensional images using structure-from-motion (SfM) techniques, and the like.

Figure 20:
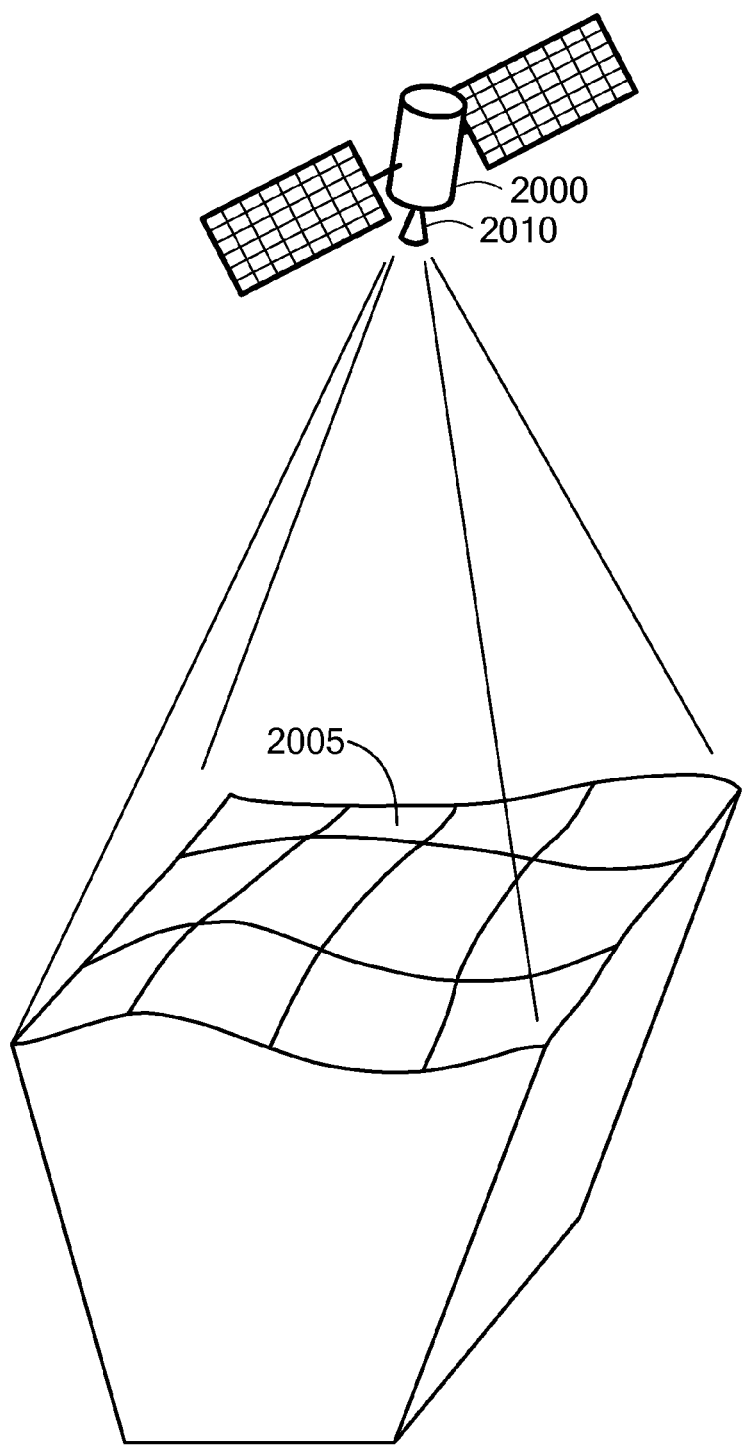
FIG. 20 is a schematic diagram of a context in which embodiments of the present invention may be used.

Ascertaining a Geographic Position, Based on Topographic Contours of Ocean Surfaces FIG. 20 is a schematic diagram of a context in which embodiments of the present invention may be used. A satellite 2000 flies over a land or ocean surface 2005. In alternative contexts, the satellite 2000 may be replaced by a missile, airplane, drone or other flying craft. The satellite 2000 includes a geographic positioning system. The geographic positioning system includes a radar altimeter, laser rangefinder or other device 2010 suitable for measuring a distance between the satellite 2000 and the surface 2005 beneath the satellite 2000. The measuring device 2010 may image a relatively large area beneath the satellite 2000, as suggested in FIG. 20. In such an embodiment, distances between the satellite 2000 and various points on the imaged surface 2005 are measured, and the measuring device 2010 generates data representing the contour (heights or height variations) of the imaged surface 2005.

The measuring device 2010 may image the entire surface 2005 at a single time, such as with a 3-dimensional imaging camera, such as a stereo camera. Alternatively, the measuring device 2010 may scan, such as by sweeping a raster signal across, all or a portion of the surface 2005. In one embodiment, the measuring device 2010 scans the surface 2005 along an axis perpendicular to the satellite's ground track. Alternatively, the measuring device 2010 may scan the surface 2005 along both an x and a y direction to generate data representing a 3-dimensional surface.

Figure 21:
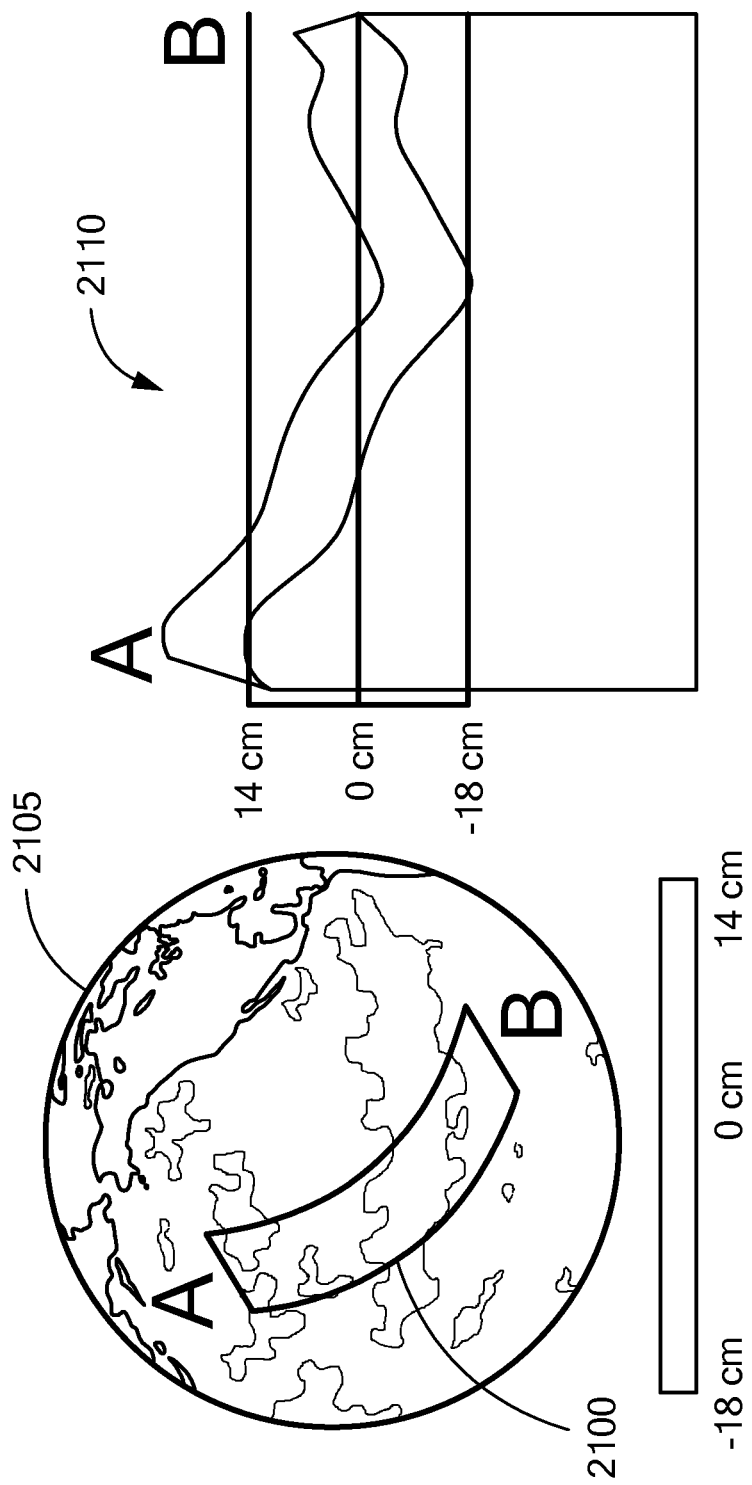
FIG. 21 is a schematic diagram of a strip of topographic information from a surface of the earth, as used by an embodiment of the present invention.

In another embodiment, the measuring device 2010 measures distances between the satellite 2000 and the surface 2005 in a narrow area beneath the satellite 2000, and thus records essentially a strip or line as the satellite 2000 orbits. A hypothetical strip or line 2100 is schematically illustrated in FIG. 21. The strip 2100 represents a portion of the surface of the ocean, extending from A to B on the earth 2105. A profile of the ocean surface corresponding to the strip 2100 is illustrated at 2110. As the satellite 2000 (FIG. 20) makes successive passes over a region including the strip 2100, the measuring device 2010 essentially raster scans the surface of the ocean and generates data representing the contour (heights or height variations) of the imaged surface 2005.

In either case, a contour matching engine compares the contour data generated by the measuring device 2010 to contour data stored in a database or predicted by a model. As noted, the data about the contours stored in the database or predicted by the model include information correlating the contours to geographic locations on the earth. Thus, if the contour matching engine finds a match, the contour matching engine outputs a geographic location on earth that corresponds to the portion of the surface 2005 observed by the measuring device 2010. The contour data generated by the measuring device 2010 may represent a strip along the surface of the earth or a wider area of the surface of the earth.

The contour matching engine may be implemented in whole or in part by a processor executing instructions stored in a memory. The instructions may cause the processor to perform an algorithm. Algorithms for contour matching are well known in the art, as evidenced by terrain contour matching (TERCOM) used in cruise missiles. Such TERCOM algorithms may be used or modified for use in the contour matching engine. The contour matching engine may be located within the satellite 2000 or elsewhere. The model may be implemented in whole or in part by a processor executing instructions stored in a memory. Similarly, the database or model may be stored in the satellite 2000 or elsewhere. The database may be stored in a read-only memory (ROM), a random-access memory (RAM), a magnetic or optical disk or any other suitable computer-readable memory. If the contour matching engine is located elsewhere, such as at a ground station or another satellite, the contour data generated by the measuring device 2010 may be sent to the location of the contour matching engine, such as via a radio link.

Figure 22:
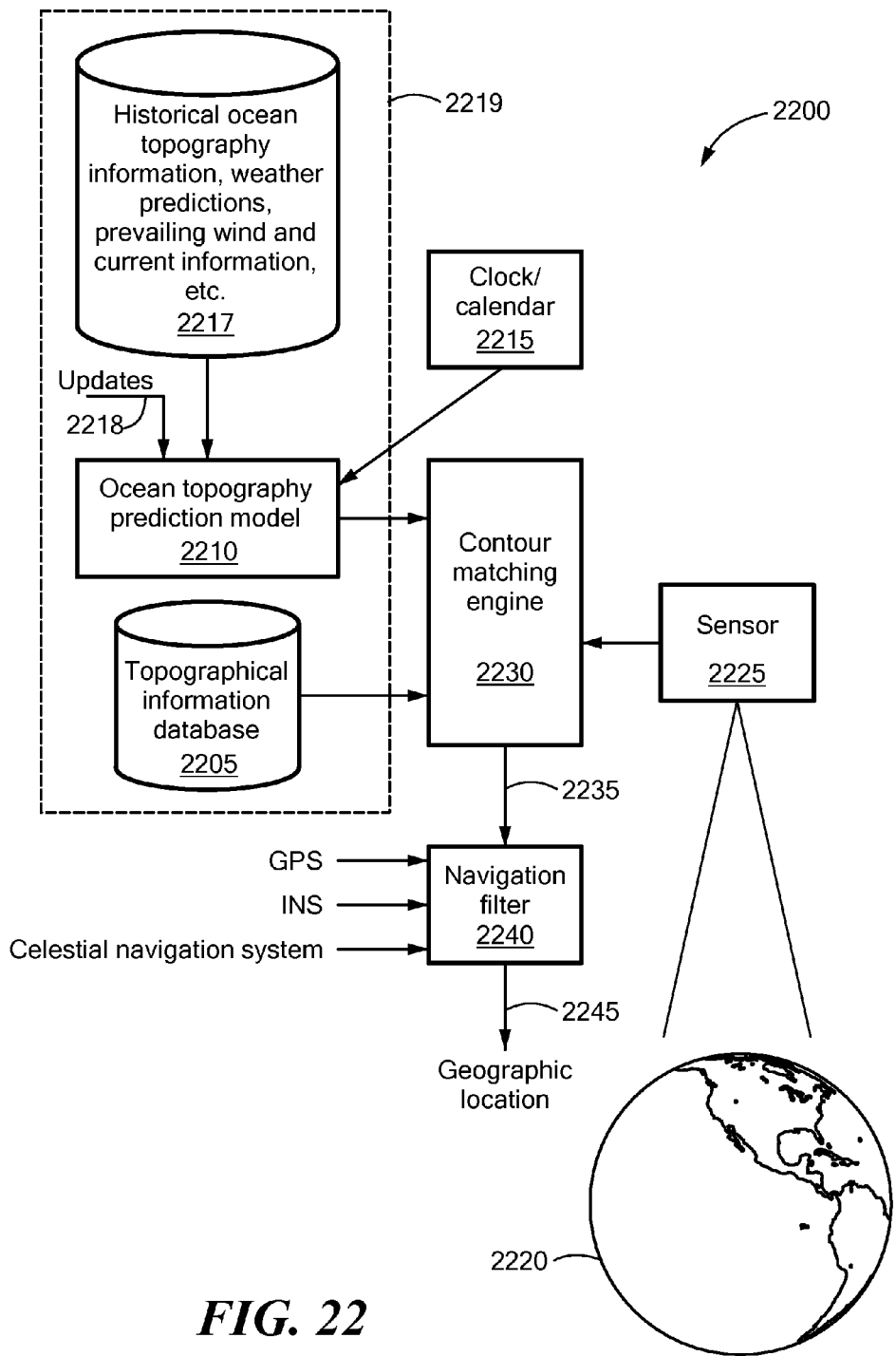
FIG. 22 is a schematic block diagram of a geographic positioning system, according to an embodiment of the present invention.

FIG. 22 is a schematic block diagram of a geographic positioning system 2200, according to an embodiment of the present invention. The geographic positioning system 2200 may be the geographic positioning system described above, with respect to FIG. 20. A topographic information database 2205 stores topographical information about at least a portion of a surface of the earth 2210.

Optionally or alternatively, an ocean topography prediction model 2210 predicts topographical information, based on a time of day or date provided by a clock 2215. As previously noted, the ocean topography prediction model 2210 is loaded with recent ocean topography information and, optionally, weather predictions and other information 2217, on which the prediction model 2210 may base its predictions. The predictions are made for the then-current time and date, i.e., the time and date on which a sensor 2225 observed the surface of the earth 2220. Optionally, the model 2210 may be periodically or occasionally updated, as indicated at 2218, with more recent ocean topography information, such as from OSTM, more recent weather or other atmospheric information and/or forecasts, particularly current and predicted wind information, more recent ocean surface temperature information, etc.

The database 2205 and/or the prediction model 2210 form a data source 2219 providing topographical information that includes topographical information about contours of a surface of at least a portion of body of water on the earth

2220. The topographical information correlates the contours with geographic locations on the earth 2220. Optionally, the database 2205 or the prediction model 2210 stores or predicts topographical information about contours of a surface of at least a non-ocean covered portion of the earth 2220. In such cases, the geographic positioning system 2200 can ascertain its location while over an ocean, land or a combination of ocean and land, as long as the location is represented in the database 2205 or by the model 2210.

The sensor 2225 is configured to detect a contour of a portion of the surface of the earth 2220. The sensor 2225 may be a radar, a radio altimeter, a 3-dimensional imaging camera, such as a stereo camera, a laser rangefinder, a LIDAR, a 3-dimensional surface synthesizer (such as a synthesizer that utilizes a structure-from-motion (SfM) technique), or the like. The sensor 2225 may be mounted to an aircraft, a spacecraft, a lighter-than-air craft (such as a suitable helium-filled balloon), a mast of a watercraft, or another object.

A contour matching engine 2230 is coupled to the sensor 2225 and to the database 2205 and/or to the prediction model 2210. The contour matching engine 2230 is configured to automatically match the detected contour from the sensor 2225 to a contour in the database 2205 or to a contour predicted by the prediction model 2210. The contour matching engine 2230 finds a best or good match between the detected contour and a contour in the database 2205 or predicted by the prediction model 2210. A best or good match may be a match within a predefined tolerance. The contour matching engine 2230 automatically provides a geographic location 2235 of the detected contour. "Automatically" here means without human intervention, apart from possibly initiating the operation.

Optionally, a navigation filter 2240 receives the geographic location 2235 from the contour matching engine 2230, as well as geographic location information from one or more other geographic positioning systems, such as a GPS, INS or celestial navigation system. The navigation filter 2240 provides geographic location information 2245, such as to a user interface display or a course correction system (not shown).

As noted, although surface height gradients are the primary features modeled and matched, other surface gradients, such as temperature, water current and color, may be used. Thus, in other embodiments, these and/or other surface gradient features may be matched by the contour matching engine 2230. In such embodiments, the sensor 2225 is suitably configured to detect the feature, such as surface temperature or color, that is matched, or the sensor 2225 is suitably configured to detect an attribute that can be converted to the feature that is matched. In some embodiments, the sensor 2225 includes a set of sensors, each sensor of the set being configured to detect one or more of the features that is to be matched. Each sensor may be sensitive to one or more appropriate stimuli, such as radar signals or color, intensity and/or timing of visible or invisible light. The sensor may also include an appropriate emitter, such as a radar transmitter or laser. For example, the sensor 2225 may include a laser altimeter and an infrared temperature sensor.

Figure 23:
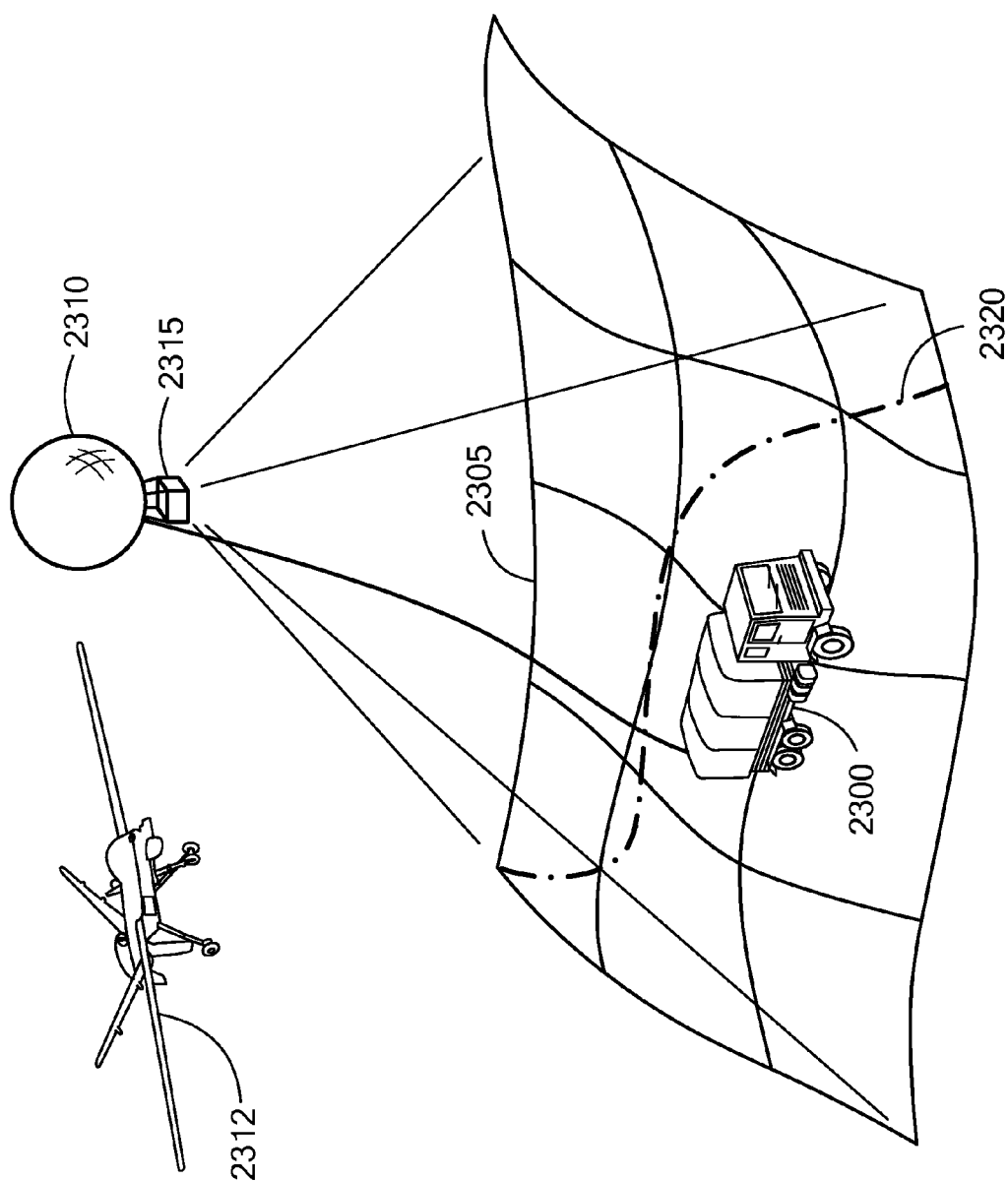
FIG. 23 is a schematic diagram of another context in which embodiments of the present invention may be used.

FIG. 23 is a schematic diagram of another context in which embodiments of the present invention may be used. A vehicle 2300 is located on a surface 2305 of the earth. The vehicle 2300 deploys a lighter-than-air craft 2310, such as a suitable helium-filled balloon 2310, to which a geographic positioning system is attached. In other contexts, the vehicle 2300 may deploy a drone 2312 or other device configured to carry a geographic positioning system aloft, or at least above the surface 2305. Attached below the lighter-than-air craft 2310, as part of the geographic positioning system, is a radar altimeter, laser rangefinder or other device 2315 suitable for measuring a distance between the lighter-than-air craft 2310 and the surface 2305 beneath the lighter-than-air craft 2310. The system depicted in FIG. 23 operates much the way the system described above, with respect to FIG. 20, operates. However, the database or predictive model used by the system of FIG. 23 may include topographic information about contours of land, in addition to information about contours of oceans. A portion of the surface 2305 may include an ocean. For example, the portion above and to the right of line 2320 may be ocean, whereas the portion below and to the left of the line 2320 may be land.

In other contexts, a water craft may deploy a mast, a lighter-than-air craft, a drone or the like, that includes a geographic positioning system, which operates substantially as described above, with respect to FIG. 23.

Figure 24:
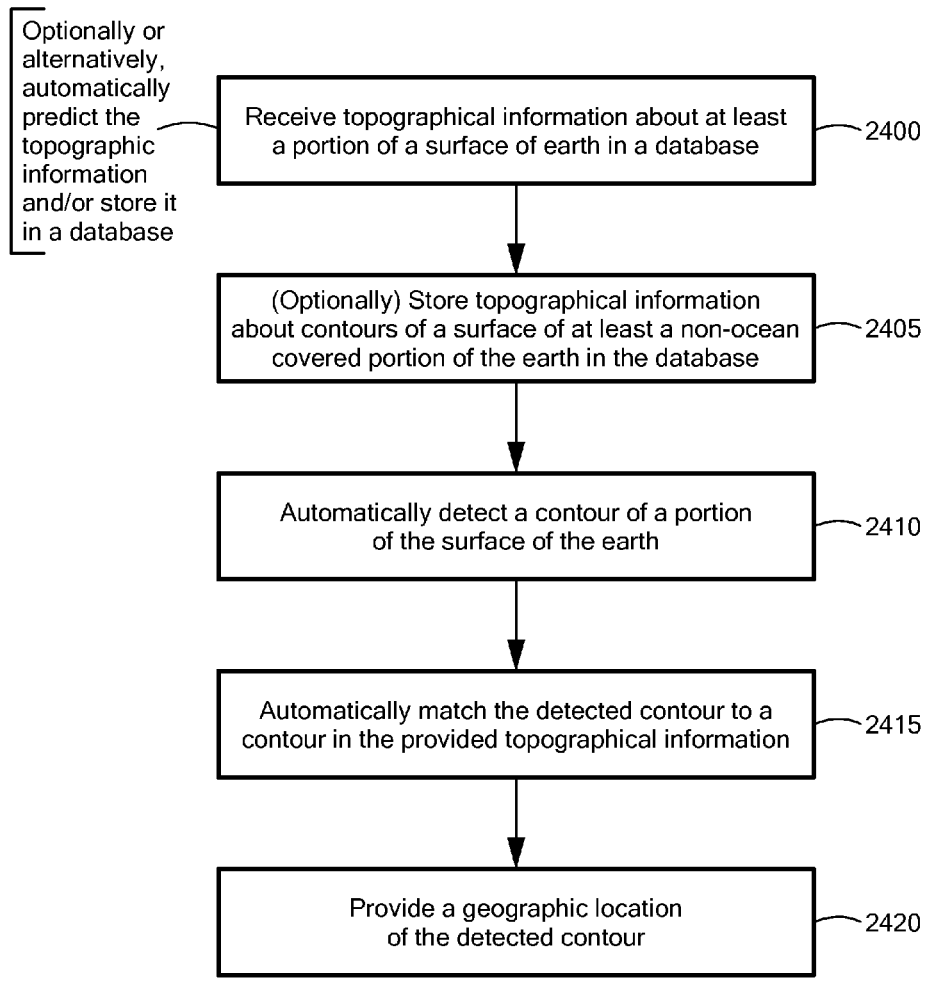
FIG. 24 contains a flowchart illustrating operation of an embodiment of the present invention.

FIG. 24 contains a flowchart illustrating operation of an embodiment of the present invention. At 2400, topographical information about at least a portion of a surface of earth is received. The topographical information may be received by predicting the information, such as based on historical ocean topographical information, and/or the topographical information may be received by retrieving the information from a database. The topographical information includes topographical information about contours of a surface of at least a portion of body of water on the earth. The topographical information correlates the contours with geographic locations on the earth. Optionally, at 2405, storing the topographical information includes storing topographical information about contours of a surface of at least a non-ocean covered portion of the earth in the database.

At 2410, a contour of a portion of the surface of the earth is automatically detected. Detecting the contour may include imaging the portion of the surface of the earth with a radar, imaging the portion of the surface of the earth with a radio altimeter, imaging the portion of the surface of the earth with a 3-dimensional imaging camera, imaging the portion of the surface of the earth with a stereo camera, imaging the portion of the surface of the earth with a laser altimeter or LIDAR, synthesizing a 3-dimesional surface, such as by employing a structure-from-motion (SfM) technique, imaging the portion of the surface of the earth from an aircraft, imaging the portion of the surface of the earth from a spacecraft, imaging the portion of the surface of the earth from a lighter-than-air craft or imaging the portion of the surface of the earth from a watercraft.

At 2415, the detected contour is automatically matched to a contour in the database or predicted by the ocean topographic model. At 2420, a geographic location of the detected contour is automatically provided (outputted). "Automatically" here means without human intervention, apart from possibly initiating the operation.

Although embodiments have been described that ascertain geographic location information, this location information may be used to guide a craft, vessel, vehicle, person or other object to a desired destination or along a desired path. In such cases, successive, time spaced-apart geographic locations may be ascertained, and these locations may be compared to a list of desired locations along a predetermined path. Errors, i.e., differences between actual and desired locations, may be calculated, and these errors may be used to correct direction of travel, speed or other parameters, so as to achieve the goal of reaching the desired destination, following the desired path, etc.

Although embodiments have been described that ascertain geographic location information based on contours of oceans of the earth, contours of liquid oceans (not necessarily containing water) on other celestial objects, such as Saturn, may be used to ascertain geographic location information, relative to such celestial objects.

While the invention is described through the above-described exemplary embodiments, modifications to, and variations of, the illustrated embodiments may be made without departing from the inventive concepts disclosed herein. Furthermore, disclosed aspects, or portions thereof, may be combined in ways not listed above and/or not explicitly claimed. Accordingly, the invention should not be viewed as being limited to the disclosed embodiments.

Although aspects of embodiments may be described with reference to flowcharts and/or block diagrams, functions, operations, decisions, etc. of all or a portion of each block, or a combination of blocks, may be combined, separated into separate operations or performed in other orders. All or a portion of each block, or a combination of blocks, may be implemented as computer program instructions (such as software), hardware (such as combinatorial logic, Application Specific Integrated Circuits (ASICs), Field-Programmable Gate Arrays (FPGAs) or other hardware), firmware or combinations thereof. Embodiments may be implemented by a processor executing, or controlled by, instructions stored in a memory. The processor may be a central processing unit (CPU), a core of a multi-core processor, a graphical processing unit (GPU) or any other suitable processor. The memory may be random access memory (RAM), read-only memory (ROM), flash memory or any other memory, or combination thereof, suitable for storing control software or other instructions and data.

Instructions defining the functions, operations, etc. of the present invention may be delivered to a processor in many forms, including, but not limited to, information permanently stored on tangible, non-transitory non-writable storage media (e.g., read-only memory devices within a computer, such as ROM, or devices readable by a computer I/O attachment, such as CD-ROM or DVD disks), information alterably stored on tangible, non-transitory writable storage media (e.g., floppy disks, removable flash memory and hard drives) or information conveyed to a computer through a communication medium, including wired or wireless computer networks. Moreover, while embodiments may be described in connection with various illustrative data structures, systems may be embodied using a variety of data structures.

What is claimed is:

1. A geographic positioning system useful above the surface of earth, comprising:
    an ocean topography prediction model providing predicted topographical information about predicted contours of a surface of at least a portion of a body of water on the earth, the predicted topographical information about the predicted contours comprising one or more of: (a) predicted surface height gradient information, (b) predicted surface temperature gradient information, (c) predicted surface color gradient information or (d) a combination thereof, the predicted topographical information correlating the predicted contours with geographic locations on the earth, the ocean topography prediction model being configured to predict the predicted topographical information based at least in part on one or more of: (a) historical ocean surface height information, (b) historical ocean temperature information, (c) historical ocean color information or (d) a combination thereof;
    a sensor configured to detect a contour of a portion of the surface of the body of water beneath the sensor by imaging the portion of the body of water from above; and
    a contour matching engine coupled to the ocean topography prediction model and to the sensor and configured to automatically match the detected contour to a predicted contour provided by the ocean topography prediction model and automatically provide a geographic location of the detected contour.

2. A geographic positioning system according to claim 1, further comprising a navigation filter coupled to receive:
    the geographic location provided by the contour matching engine; and
    at least one other geographic location provided by a corresponding at least one other geographic positioning system.

3. A geographic positioning system according to claim 2, wherein the at least one other geographic positioning system comprises an inertial navigation system.

4. A geographic positioning system according to claim 1, wherein the ocean topography prediction model is configured to predict the predicted topographical information based at least in part on at least one of:
    a time at which the sensor detects the contour;
    a weather prediction;
    information about a prevailing wind; and
    information about a current in the body of water.

5. A geographic positioning system according to claim 1, wherein the ocean topography prediction model comprises a database storing the topographical information about the surface of the at least a portion of the body of water.

6. A geographic positioning system according to claim 5, wherein the topographical information stored in the database includes topographical information about contours of a portion of the surface of the earth not covered by the body of water.

7. A geographic positioning system according to claim 1, wherein the predicted topographical information provided by the ocean topography prediction model includes topographical information about contours of a portion of the surface of the earth not covered by the body of water.

8. A geographic positioning system according to claim 1, wherein the sensor comprises at least one of:
    a radar;
    a radio altimeter;
    a 3-dimensional imaging camera;
    a stereo camera;
    a laser altimeter;
    a LIDAR;
    a surface temperature sensor; and
    a surface color sensor.

9. A method for ascertaining a geographic position above the surface of earth, the method comprising:
    generating topographical information about contours of a surface of at least a portion of a body of water on the earth, the topographical information correlating the contours with geographic locations on the earth, wherein generating the topographical information comprises executing on a processor the steps of:
    (a) receiving historical contour information about the body of water on the surface of the earth;

(b) automatically generating a mathematical model of a state of the body of water corresponding to a start time, based at least in part on the historical contour information;
(c) setting an index time equal to the start time;
(d) automatically estimating rates of change of respective portions of the modeled state of the body of water;
(e) incrementing the index time;
(f) automatically estimating a new state of the body of water corresponding to the index time, based on the estimated rates of change and a previous modeled state of the body of water, thereby automatically generating a new mathematical model of the state of the body of water;
(g) automatically replacing the previous mathematical model with the new mathematical model of the state of the body of water;
(h) repeating at least (f) until the index time reaches a predetermined value; and
(i) outputting predicted surface contour information about the body of water, including one or more of (1) surface height contour information about the body of water, (2) surface temperature contour information about the body of water, (3) surface color contour information about the body of water or (4) a combination thereof, based on the new mathematical model of the state of the body of water;
using a sensor, automatically detecting a contour of a portion of the surface of the body of water beneath the sensor by imaging the portion of the body of water from above;
automatically matching the detected contour to a contour in the generated topographical information; and
automatically providing a geographic location of the detected contour.

10. The method of claim 9, further comprising:
providing the geographic location to a navigation filter;
providing at least one other geographic location from a corresponding at least one other geographic positioning system to the navigation filter; and
automatically calculating a solution geographic location by the navigation filter, based on the geographic location and the at least one other geographic location.

11. The method of claim 9, wherein generating the topographical information comprises predicting the topographical information based at least in part on historical ocean topographical information.

12. The method of claim 11, wherein receiving generating the topographical information further comprises predicting the topographical information based at least in part on at least one of:
a time at which the sensor detects the contour of the portion of the surface of the earth;
a weather prediction;
information about a prevailing wind; and
information about a current in the body of water.

13. The method of claim 9, wherein generating the topographical information comprises retrieving, from a database, topographical information about contours of a portion of the surface of the earth not covered by the body of water.

14. The method of claim 9, wherein detecting the contour of the portion of the surface of the earth comprises imaging at least one of:
the portion of the surface of the earth with a radar;
the portion of the surface of the earth with a radio altimeter;
the portion of the surface of the earth with a 3-dimensional imaging camera;
the portion of the surface of the earth with a stereo camera;
the portion of the surface of the earth with a laser altimeter;
the portion of the surface of the earth with a LIDAR;
the portion of the surface of the earth from an aircraft;
the portion of the surface of the earth from a spacecraft;
the portion of the surface of the earth from a lighter-than-air craft; and
the portion of the surface of the earth from a watercraft.

15. A computer program product for ascertaining a geographic position from above the surface of earth, the computer program product comprising a non-transitory computer-readable medium having computer readable program code stored thereon, the computer readable program code configured to cause a processor executing the program code to:
generate topographical information about contours of a surface of at least a portion of a body of water on a surface of the earth, the topographical information correlating the contours with geographic locations on the earth, wherein generating the topographical information comprises executing on a processor the steps of:
(a) receiving historical contour information about the body of water on the surface of the earth;
(b) automatically generating a mathematical model of a state of the body of water corresponding to a start time, based at least in part on the historical contour information;
(c) setting an index time equal to the start time;
(d) automatically estimating rates of change of respective portions of the modeled state of the body of water;
(e) incrementing the index time;
(f) automatically estimating a new state of the body of water corresponding to the index time, based on the estimated rates of change and a previous modeled state of the body of water, thereby automatically generating a new mathematical model of the state of the body of water;
(g) automatically replacing the previous mathematical model with the new mathematical model of the state of the body of water;
(h) repeating at least (f) until the index time reaches a predetermined value; and
(i) outputting predicted surface contour information about the body of water, including one or more of: (1) surface height contour information about the body of water, (2) surface temperature contour information about the body of water, (3) surface color contour information about the body of water or (4) a combination thereof, based on the new mathematical model of the state of the body of water;
using a sensor, detect a contour of a portion of the surface of the body of water beneath the sensor by imaging the portion of the body of water from above;
automatically match the detected contour to a contour in the generated topological information; and
automatically provide a geographic location of the detected contour.

16. The method of claim 9, wherein outputting the predicted surface contour information about the body of water comprises outputting:
predicted surface color contour information about the body of water.

17. The method of claim 9, further comprising:
receiving a weather forecast; and wherein:
automatically generating the mathematical model of the state of the body of water comprises automatically generating the mathematical model of the state of the body of water based at least in part on the weather forecast.

18. A geographic positioning system according to claim 2, wherein the at least one other geographic positioning system comprises a global positioning system (GPS).

19. A geographic positioning system according to claim 2, wherein the at least one other geographic positioning system comprises a celestial sighting positioning system.

20. The method of claim 9, wherein outputting the predicted surface contour information about the body of water comprises outputting predicted surface temperature contour information about the body of water.

21. The method of claim 9, wherein outputting the predicted surface contour information about the body of water comprises outputting predicted surface height contour information about the body of water.

22. A geographic positioning system useful above the surface of earth, comprising:
an ocean topography prediction model providing predicted topographical information about predicted contours of a surface of at least a portion of a body of water on the earth, the predicted topographical information about the predicted contours comprising predicted surface height gradient information, the predicted topographical information correlating the predicted contours with geographic locations on the earth, the ocean topography prediction model being configured to predict the predicted topographical information based at least in part on historical ocean surface height information;
a sensor configured to detect a contour of a portion of the surface of the body of water beneath the sensor by imaging the portion of the body of water from above; and
a contour matching engine coupled to the ocean topography prediction model and to the sensor and configured to automatically match the detected contour to a predicted contour provided by the ocean topography prediction model and automatically provide a geographic location of the detected contour.

23. A geographic positioning system useful above the surface of earth, comprising:
an ocean topography prediction model providing predicted topographical information about predicted contours of a surface of at least a portion of a body of water on the earth, the predicted topographical information about the predicted contours comprising predicted surface temperature gradient information, the predicted topographical information correlating the predicted contours with geographic locations on the earth, the ocean topography prediction model being configured to predict the predicted topographical information based at least in part on historical ocean temperature information;
a sensor configured to detect a contour of a portion of the surface of the body of water beneath the sensor by imaging the portion of the body of water from above; and
a contour matching engine coupled to the ocean topography prediction model and to the sensor and configured to automatically match the detected contour to a predicted contour provided by the ocean topography prediction model and automatically provide a geographic location of the detected contour.

24. A geographic positioning system useful above the surface of earth, comprising:
an ocean topography prediction model providing predicted topographical information about predicted contours of a surface of at least a portion of a body of water on the earth, the predicted topographical information about the predicted contours comprising predicted surface color gradient information, the predicted topographical information correlating the predicted contours with geographic locations on the earth, the ocean topography prediction model being configured to predict the predicted topographical information based at least in part on historical ocean color information;
a sensor configured to detect a contour of a portion of the surface of the body of water beneath the sensor by imaging the portion of the body of water from above; and
a contour matching engine coupled to the ocean topography prediction model and to the sensor and configured to automatically match the detected contour to a predicted contour provided by the ocean topography prediction model and automatically provide a geographic location of the detected contour.

* * * * *

UNITED STATES PATENT AND TRADEMARK OFFICE
CERTIFICATE OF CORRECTION

| | | |
|---|---|---|
| PATENT NO. | : 9,653,003 B2 | Page 1 of 1 |
| APPLICATION NO. | : 14/636419 | |
| DATED | : May 16, 2017 | |
| INVENTOR(S) | : Laine et al. | |

It is certified that error appears in the above-identified patent and that said Letters Patent is hereby corrected as shown below:

In the Claims

In Column 14, Line 36 Claim 5:
Replace "storing the topographical information"
With "storing topographical information"

In Column 15, Line 49 Claim 12:
Replace "wherein receiving generating"
With "wherein generating"

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*